(12) United States Patent
Hue et al.

(10) Patent No.: US 11,190,145 B2
(45) Date of Patent: Nov. 30, 2021

(54) POWER AMPLIFIER WITH INTEGRATED BIAS CIRCUIT HAVING MULTI-POINT INPUT

(71) Applicant: NXP USA, Inc., Austin, TX (US)

(72) Inventors: Xavier Hue, Frouzins (FR); Margaret Szymanowski, Chandler, AZ (US); Xin Fu, Chandler, AZ (US)

(73) Assignee: NXP USA, Inc., Austin, TX (US)

(*) Notice: Subject to any disclaimer, the term of this patent is extended or adjusted under 35 U.S.C. 154(b) by 160 days.

(21) Appl. No.: 16/685,531

(22) Filed: Nov. 15, 2019

(65) Prior Publication Data
US 2020/0186096 A1 Jun. 11, 2020

(30) Foreign Application Priority Data
Dec. 5, 2018 (EP) .................................... 18306618

(51) Int. Cl.
*H03F 1/02* (2006.01)
*H01L 23/66* (2006.01)
(Continued)

(52) U.S. Cl.
CPC ........... *H03F 1/0288* (2013.01); *H01L 23/66* (2013.01); *H01L 24/06* (2013.01); *H01L 24/48* (2013.01); *H01L 24/85* (2013.01); *H03F 1/0211* (2013.01); *H03F 1/565* (2013.01); *H03F 3/211* (2013.01); *H03F 3/213* (2013.01); *H01L 24/49* (2013.01); *H01L 2223/665* (2013.01); *H01L 2223/6611* (2013.01); *H01L 2223/6655* (2013.01); *H01L 2224/48247* (2013.01);
(Continued)

(58) Field of Classification Search
CPC ...................................................... H03F 1/0288
See application file for complete search history.

(56) References Cited

U.S. PATENT DOCUMENTS 9,543,914 B2   1/2017   Bouny
2002/0180553 A1   12/2002   Buer
(Continued)

OTHER PUBLICATIONS

LV,Guanshent et al.; Ä Compact and Broadband Ka-band Asymmetrical GaAs Doherty Power Amplifier MMIC for 5G Communications; 2018 IEEE/MTT-S International Microwave Symposium; pp. 808-811 (Jun. 10, 2018).

*Primary Examiner* — Patricia T Nguyen

(57) ABSTRACT

A power amplifier includes a semiconductor die, and an amplifier and bias circuit integrally formed with the semiconductor die. The die has opposed first and second sides, and a device bisection line extends between the first and second sides. The bias circuit includes a multi-point input terminal with first and second terminals that are electrically connected through a conductive path that extends across the device bisection line, and one or more bias circuit components connected between the multi-point input terminal and the amplifier. The amplifier may include a field effect transistor (FET) with gate and drain terminals, and the bias circuit component(s) are electrically connected between the multi-point input terminal and the gate terminal. In addition or alternatively, the bias circuit component(s) are electrically connected between a multi-point input terminal and the drain terminal. The one or more components may include a resistor-divider circuit.

15 Claims, 5 Drawing Sheets

(51) Int. Cl.
*H01L 23/00* (2006.01)
*H03F 1/56* (2006.01)
*H03F 3/21* (2006.01)
*H03F 3/213* (2006.01)

(52) U.S. Cl.
CPC ......... *H01L 2224/49171* (2013.01); *H01L 2224/49175* (2013.01); *H01L 2924/30111* (2013.01); *H03F 2200/222* (2013.01); *H03F 2200/318* (2013.01); *H03F 2200/451* (2013.01); *H03F 2203/21103* (2013.01)

(56) References Cited

U.S. PATENT DOCUMENTS

| | | |
|---|---|---|
| 2004/0080044 A1 | 4/2004 | Moriyama et al. |
| 2011/0025423 A1* | 2/2011 | Brown .................. H03F 3/195 330/307 |
| 2015/0119107 A1* | 4/2015 | Bouny ................ H04W 88/08 455/561 |
| 2015/0145601 A1 | 5/2015 | Moronval et al. |
| 2017/0085228 A1* | 3/2017 | Abdo .................. H01L 23/481 |
| 2017/0230009 A1* | 8/2017 | Moronval ............. H03F 1/0288 |
| 2020/0014342 A1* | 1/2020 | Jones .................. H03F 1/0288 |
| 2021/0050820 A1* | 2/2021 | Khalil .................... H03F 1/56 |

\* cited by examiner

POWER AMPLIFIER WITH INTEGRATED BIAS CIRCUIT HAVING MULTI-POINT INPUT

CROSS-REFERENCE TO RELATED APPLICATION

This application claims priority under 35 U.S.C. 119(b) to European patent application No. 18306618.2, filed on Dec. 5, 2018.

TECHNICAL FIELD

Embodiments of the subject matter described herein relate generally to multiple-path power amplifiers, and more particularly to Doherty power amplifiers.

BACKGROUND

A typical Doherty power amplifier (PA) includes a signal splitter to receive and divide an input radio frequency (RF) signal, a main amplifier to amplify a first signal from the splitter, a peaking amplifier to amplify a second signal from the splitter, a signal combiner to combine the amplified signals from the main and peaking amplifiers, and various impedance transformation and phase delay elements to ensure that the amplified signals are combined in phase, and that desirable impedances are present at various points within the Doherty PA. The signal splitter and signal combiner are commonly implemented on a printed circuit board (PCB) substrate, and the main and peaking amplifiers are implemented using one or more discretely-packaged devices that are physically coupled to the PCB substrate.

In modern wireless 4G and 5G communication systems, the design of RF power amplifiers becomes more complicated. Some of these systems require the PA to operate at very low power output back-off (e.g., 8 to 12 decibels (dB)) for good linearity, while limiting signal compression associated with high peak-to-average power ratio signals and achieving high power added efficiency. Doherty PA and inverted Doherty PA configurations remain popular in wireless base stations. However, high levels of integration are desired to meet the stringent requirements of modern wireless standards, including providing wide instantaneous bandwidths and high efficiency.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
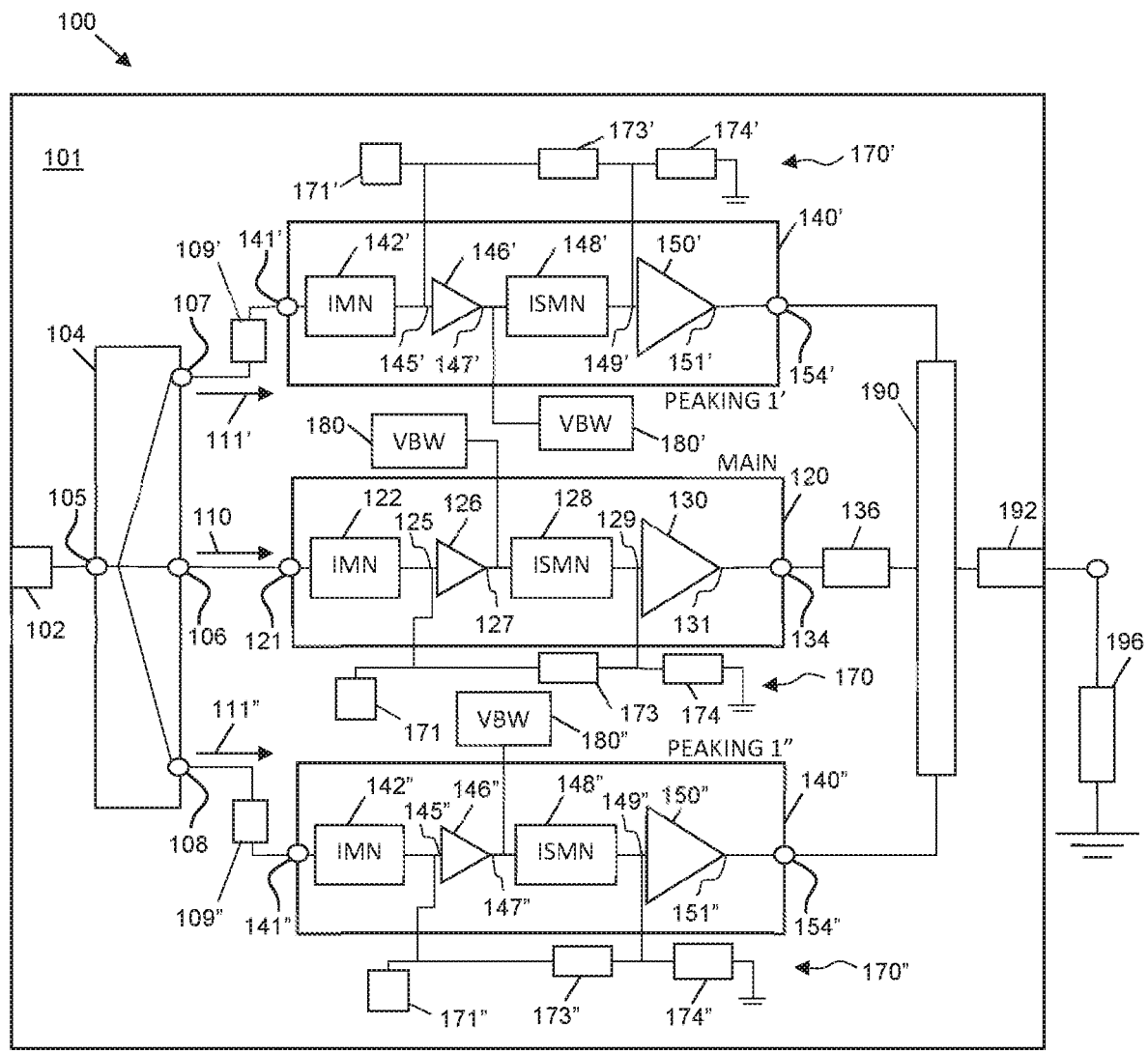
FIG. 1 is a simplified schematic of an integrated Doherty power amplifier, in accordance with an example embodiment.

Embodiments of the inventive subject matter include a monolithic (i.e., integrally formed in and/or on a single semiconductor die), multiple-path power amplifier (e.g., Doherty amplifier) with an on-die signal combiner connected to the outputs of the multiple amplifier paths. In a conventional Doherty amplifier, distinct dies used for the main and peaking amplifiers are packaged in a discrete power amplifier device, and amplified main and peaking signals are provided through separate output leads. The amplified main and peaking signals are then combined together by a Doherty combiner implemented on a printed circuit board (PCB) to which the discrete power amplifier device is coupled. In a mass production environment, various performance issues arise for conventional Doherty amplifiers due to placement tolerances for main and peaking power amplifier dies, variation in wirebond lengths and heights within the devices, and variations in the structures used to implement the Doherty combiner at the PCB level.

Embodiments of Doherty amplifiers disclosed herein may reduce such performance issues by integrating the main and peaking amplifiers and the signal combiner within a single integrated circuit die. These embodiments eliminate device-to-device production variation associated with die placement, and also may result in reductions in wirebond length and height variations. Accordingly, Doherty amplifiers with more consistent RF performance may be produced.

In addition, in various embodiments, the signal combiner is implemented with a single conductive structure that is integrally formed in the die and directly coupled to the drain terminals of the peaking transistor(s). Further, the die includes a high resistivity substrate, that enables the signal combiner to exhibit acceptably low losses.

Because the signal combiner is implemented very close to the intrinsic drain(s) of the peaking amplifier(s), a 90-0 Doherty amplifier may be achieved. The 90 degree phase difference between the main and peaking amplifier outputs includes a simulated quarter wave transmission line having a CLC topology. The CLC topology includes the drain-source capacitances of the main and peaking transistors, in combination with the inductance implemented between the main amplifier output and the Doherty combining structure. The inductance is achieved, in an embodiment, using wirebonds that launch (from the main amplifier drain terminal) and land (on the signal combiner). Because the main amplifier drain terminal and the signal combiner are integrally-formed in and on the same die, the wirebond length and height can be tightly controlled, and thus the inductance value tolerance is improved when compared with conventional Doherty amplifier implementations.

The below-described and illustrated embodiments of Doherty amplifier ICs correspond to two-way Doherty amplifiers that include a main amplifier and one peaking amplifier. Although not explicitly illustrated, other embodiments may include "N-way" Doherty power amplifiers, where N>2, in which the number of peaking amplifiers equals N−1.

FIG. 1 is a simplified schematic of an integrated Doherty power amplifier 100, in accordance with an example embodiment. Doherty amplifier 100 includes an input node 102, an output node 192, a power splitter 104 (or splitter), a main amplification path 120, a peaking amplification path 111, and a combining node structure 190. A load 196 may be coupled to the combining node structure 190 (e.g., through an impedance transformer, not shown) to receive an amplified RF signal from amplifier 100.

Doherty power amplifier 100 is considered to be a "two-way" Doherty power amplifier, which includes one main amplifier 120 and one peaking amplifier 140. The main amplifier 120 provides amplification along a first amplification path 110, and the peaking amplifier 140 provides amplification along a second amplification path 111. In the embodiment depicted in FIG. 1, the peaking amplifier 140 is "divided", in that the amplification performed by the peaking amplifier 140 actually is performed by two, substantially identical, peaking amplifier portions 140', 140" (collectively referred to as peaking amplifier 140) along two parallel and substantially identical amplification paths 111', 111" (collectively referred to as amplification path 111). As will be explained in more detail in conjunction with FIG. 2, the peaking amplification paths 111', 111" are physically located on opposite sides of the main amplification path 110, according to an embodiment.

Although the main and peaking amplifiers 120, 140 may be of equal size (e.g., in a symmetric Doherty configuration with a 1:1 main-to-peaking size ratio), the main and peaking amplifiers 120, 140 may have unequal sizes, as well (e.g., in various asymmetric Doherty configurations). In an asymmetric two-way Doherty amplifier configuration, the peaking power amplifier 140 typically is larger than the main power amplifier 120 by some multiplier. For example, the peaking power amplifier 140 may be twice the size of the main power amplifier 120 so that the peaking power amplifier 140 has twice the current carrying capability of the main power amplifier 120. Asymmetric main-to-peaking amplifier size ratios other than a 1:2 ratio may be implemented, as well.

Power splitter 104 is configured to divide the power of an input RF signal received at input node 102 into main and peaking portions of the input signal. Because the peaking amplifier 140 is implemented using two peaking amplifier portions 140', 140", as explained above, the peaking portion of the input signal actually consists of two peaking input signals. Accordingly, power splitter 104 is configured to divide the power of the input RF signal received at input node 102 into one main portion of the input signal and two peaking portions of the input signal. The main input signal is provided to the main amplification path 120 at power splitter output 106, and the peaking input signals are provided to the peaking amplification paths 111', 111" at power splitter outputs 107 and 108. During operation in a full-power mode when both the main and peaking amplifiers 120, 140 (including 140' and 140") are supplying current to the load 196, the power splitter 104 divides the input signal power between the amplification paths 110, 111', 111".

For example, the power splitter 104 may divide the power equally, such that roughly one third of the input signal power is provided to each path 110, 111', 111". This may be the case, for example, when Doherty amplifier 100 has an asymmetric Doherty amplifier configuration in which the peaking amplifier 140 is approximately twice the size of the main amplifier 120 (i.e., the Doherty amplifier 100 has an asymmetric configuration with a 1:2 main-to-peaking size ratio). With a 1:2 main-to-peaking size ratio, the combined size of the peaking amplifier portions 140', 140" is about twice the size of the main amplifier 120, which may be achieved when each of amplifiers 120, 140', 140" is about equal in size. Alternatively, the power splitter 104 may divide the power unequally, particularly when the Doherty amplifier 100 has an asymmetric configuration other than a 1:2 main-to-peaking size ratio, or when the Doherty amplifier 100 has a symmetric configuration. In the case of a symmetric Doherty amplifier configuration, the size of the peaking amplifier 140 is about equal to the size of the main amplifier 120 (i.e., the Doherty amplifier 100 has a symmetric configuration with a 1:1 main-to-peaking size ratio). With a 1:1 main-to-peaking size ratio, the combined size of the peaking amplifier portions 140', 140" is about equal to the size of the main amplifier 120, which may be achieved when each of amplifiers 140', 140" is about half the size of amplifier 120. In that case, the power splitter 104 may divide the power so that about half of the input signal power is provided to the main amplification path 120 at power splitter output 106, and about on quarter of the input signal power is provided to each of the peaking amplification paths 111', 111" at power splitter outputs 107 and 108.

Essentially, the power splitter 104 divides an input RF signal supplied at the input node 102, and the divided signals are separately amplified along the main and peaking amplification paths 110, 111', 111". The amplified signals are then combined in phase at the combining node structure 190. It is important that phase coherency between the main and peaking amplification paths 110, 111', 111" is maintained across a frequency band of interest to ensure that the amplified main and peaking signals arrive in phase at the combining node structure 190, and thus to ensure proper Doherty amplifier operation. In the Doherty amplifier configuration depicted in FIG. 1 (i.e., a non-inverted Doherty configuration, as described below), input phase delay circuits 109', 109" are coupled between power splitter outputs 107 and 108 and peaking amplifier inputs 141', 141". According to an embodiment, each input phase delay circuit 109', 109" applies about 90 degrees of phase delay to the peaking input signals before they are provided to the peaking amplifier portions 140', 140". For example, each input phase delay circuit 109', 109" may include a quarter wave transmission line, a lumped-element delay circuit, or another suitable type of delay element with an electrical length of about 90 degrees.

Each of the main amplifier 120 and the peaking amplifier portions 140', 140" includes a single power transistor or multiple cascaded power transistors for amplifying an RF signal conducted through the amplifier 120, 140', 140". As used herein, the term "transistor" means a field effect transistor (FET) or another type of suitable transistor. For example, a "FET" may be a metal-oxide-semiconductor FET (MOSFET), a laterally-diffused MOSFET (LDMOS FET), an enhancement-mode or depletion-mode high electron mobility transistor (HEMT), or another type of FET. According to various embodiments, each of the power transistors in the main and peaking amplifier portions 120, 140', 140" may be implemented, for example, using a silicon-based FET (e.g., an LDMOS FET), a silicon-germanium (SiGe) based FET, or a III-V FET (e.g., a HEMT), such as a gallium nitride (GaN) FET (or another type of III-V transistor, including a gallium arsenide (GaAs) FET, a gallium phosphide (GaP) FET, an indium phosphide (InP) FET, or an indium antimonide (InSb) FET).

According to an embodiment, the main amplifier 120 is a two-stage amplifier, which includes a relatively low-power pre-amplifier 126 and a relatively high-power final-stage amplifier 130 connected in a cascade arrangement between main amplifier input 121 and main amplifier output 134. In the main amplifier cascade arrangement, an output 127 of the pre-amplifier 126 is electrically coupled to an input 129 of the final-stage amplifier 130. Similarly, each of the peaking amplifier portions 140', 140" is a two-stage amplifier, which includes a relatively low-power pre-amplifier 146', 146" and a relatively high-power final-stage amplifier 150', 150" connected in a cascade arrangement between a peaking amplifier input 141', 141" and a peaking amplifier output 154', 154". In each peaking amplifier cascade arrangement, an output 147', 147" of the pre-amplifier 146', 146" is electrically coupled to an input 149', 149" of the final-stage amplifier 150', 150". In other embodiments, each of the main amplifier 120 and the peaking amplifier portions 140', 140" may be a single-stage amplifier, or may include more than two, cascade-coupled amplification stages. Input and inter-stage impedance matching networks 122, 142', 142", 128, 148', 148" (IMN, ISMN) may be implemented, respectively, at the input 125, 145', 145" of each pre-amplifier 126, 146', 146" and between each pre-amplifier 126, 146', 146" and each final-stage amplifier 130, 150', 150". In each case, the matching networks 122, 142', 142", 128, 148', 148" may incrementally increase the circuit impedance toward the load impedance.

During operation of Doherty amplifier 100, the main amplifier 120 is biased to operate in class AB mode, and the peaking amplifier 140 typically is biased to operate in class C mode. In some configurations, the peaking amplifier 140 may be biased to operate in class B or deep class B modes. At low power levels, where the power of the input signal at node 102 is lower than the turn-on threshold level of peaking amplifier 140, the amplifier 100 operates in a low-power (or back-off) mode in which the main amplifier 120 is the only amplifier supplying current to the load 196. When the power of the input signal exceeds a threshold level of the peaking amplifier 140, the amplifier 100 operates in a high-power mode in which the main amplifier 120 and the peaking amplifier 140 both supply current to the load 196. At this point, the peaking amplifier 140 provides active load modulation at combining node structure 190, allowing the current of the main amplifier 120 to continue to increase linearly. As will be explained in more detail in conjunction with FIG. 2, later, gate biasing of the main and peaking amplifiers 120, 140 is performed using one or more resistor-divider gate bias circuits 170, 170', 170" (e.g., resistor-divider gate bias circuits 270, 270', 270", FIG. 2), in an embodiment, where each resistor-divider gate bias circuit 170, 170', 170" includes at least one resistor 173, 174, 173', 173", 174', 174" electrically coupled between a gate bias voltage input 170, 170', 170" and an input 125, 129, 145', 145", 149', 149" (e.g., a gate terminal) of each amplifier 126, 130, 146', 146", 150', 150".

In addition, embodiments of the inventive subject matter may include one or more video bandwidth (VBW) circuits 180, 180', 180" coupled between each amplification path 110, 111', 111" and a ground reference. The VBW circuits 180, 180', 180" are configured to improve the low frequency resonance (LFR) of amplifier 100 caused by the interaction between various circuitry and structures of the amplifier 100 by presenting a low impedance at envelope frequencies and/or a high impedance at RF frequencies. The VBW circuits 180, 180', 180" essentially may be considered to be "invisible" from an RF matching standpoint, as they primarily effect the impedance at envelope frequencies (i.e., VBW circuits 180, 180', 180" provide terminations for signal energy at the envelope frequencies of amplifier 100). The VBW circuits 180, 180', 180" may have any of a number of configurations. In some embodiments, each VBW circuit 180, 180', 180" includes a series circuit of a resistor, an inductor, and a capacitor coupled between a point along an amplification path 110, 111', 111" and the ground reference. For example, in FIG. 1, each VBW circuit 180, 180', 180" is coupled between the output 127, 147', 147" of a pre-amplifier 126, 146', 146" and the ground reference. In other embodiments, a VBW circuit 180, 180', 180" may be coupled between the output 131, 151', 151" of a final-stage amplifier 130, 150', 150" and a ground reference, or a VBW circuit 180, 180', 180" may be coupled between the input 125, 145', 145" of a pre-amplifier 126, 146', 146" and the ground reference. Multiple VBW circuits may be coupled along multiple points of each amplification path 110, 111', 111", as well.

Doherty amplifier 100 has a "non-inverted" load network configuration. In the non-inverted configuration, the input circuit is configured so that the input signals supplied to the peaking amplifier portions 140', 140" are delayed by 90 degrees with respect to the input signal supplied to the main amplifier 120 at the center frequency of operation, fo, of the amplifier 100. To ensure that the main and peaking input RF signals arrive at the main and peaking amplifiers 120, 140, 140" with about 90 degrees of phase difference, as is fundamental to proper Doherty amplifier operation, input phase delay circuits 109', 109" each apply about 90 degrees of phase delay to the peaking input signals before they are provided to the peaking amplifier portions 140', 140", as described above.

To compensate for the resulting 90 degree phase delay difference between the main and peaking amplification paths 110, 111', 111" at the inputs of amplifiers 120, 140', 140" (i.e., to ensure that the amplified signals arrive in phase at the combining node structure 190), an output phase delay circuit 136 is configured to apply about a 90 degree phase delay to the signal between the output of main amplifier 120 and the combining node structure 190.

Alternate embodiments of Doherty amplifiers may have an "inverted" load network configuration. In such a configuration, the amplifier is configured so that an input signal supplied to the main amplifier 120 is delayed by about 90 degrees with respect to the input signals supplied to the peaking amplifier portions 140', 140" at the center frequency of operation, fo, of the amplifier 100, and output phase delay circuits are configured to apply about a 90 degree phase delay to the signals between the outputs of the peaking amplifier portions 140', 140" and the combining node structure 190.

Figure 2:
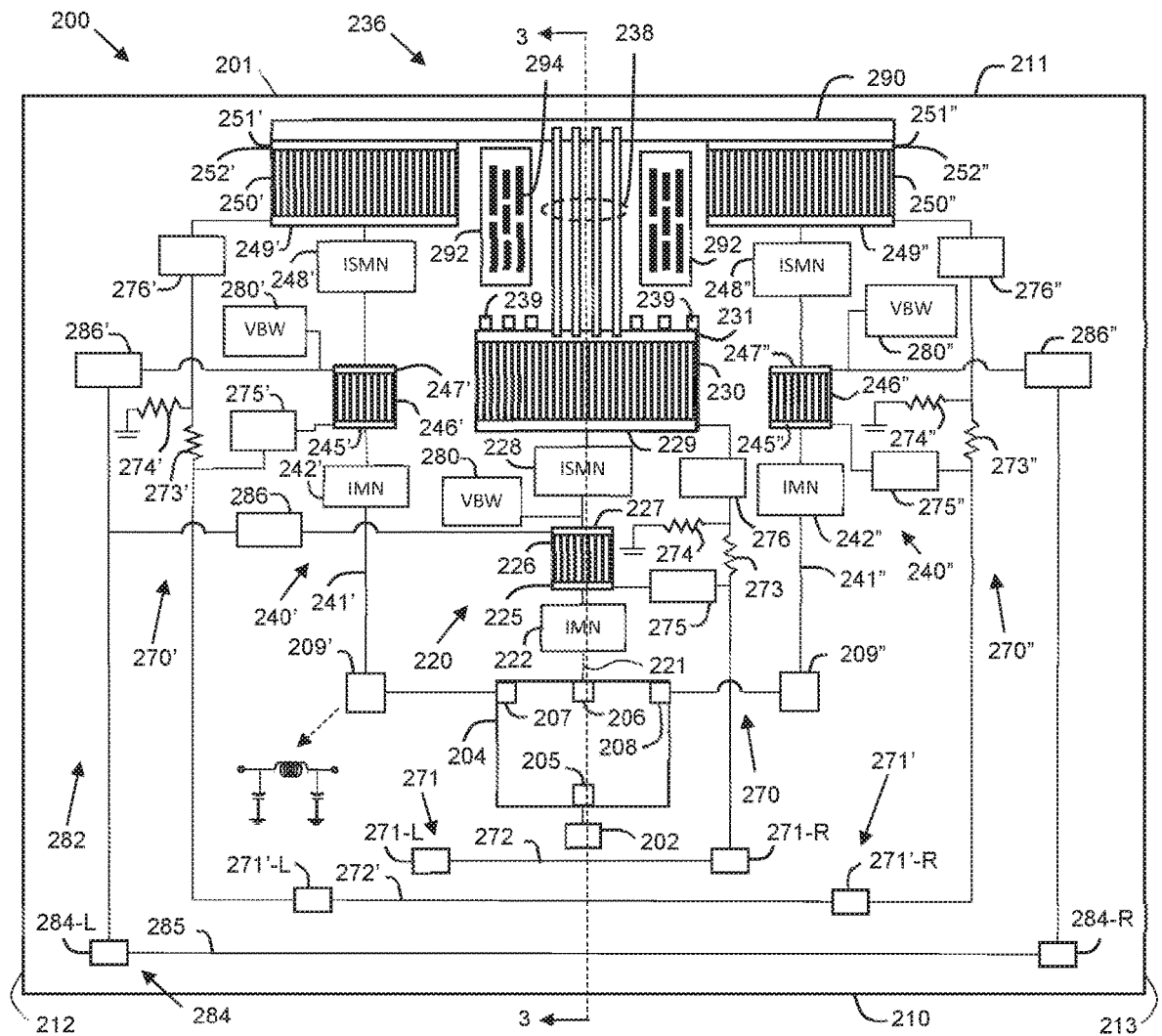
FIG. 2 is a top view of a Doherty power amplifier integrated circuit (IC), in accordance with an example embodiment.

Doherty amplifier 100 is "integrated," as that term is used herein, because at least the main amplifier 120 (e.g., including the pre-amplifier 122 and the final-stage amplifier 130), the peaking amplifier 140 (including the pre-amplifiers 146', 146" and the final-stage amplifiers 150', 150"), and the combining node structure 190 are integrally- and monolithically-formed in one single IC die 101 (e.g., die 201, FIG. 2), which may be referred to herein as an "integrated Doherty amplifier die." According to an embodiment, all or portions of the input and inter-stage impedance matching networks 122, 142', 142", 128, 148', 148" also may be integrally- and monolithically-formed in the same IC die (e.g., die 201, FIG. 2). Alternatively, all or portion of the input impedance matching networks 122, 142', 142" may be implemented in one or more components that are distinct from the IC die that includes the main and peaking amplifiers 120, 140. According to a further embodiment, the input node 102, power splitter 104, and output node 192 also are integrally- and monolithically-formed in the same IC die (e.g., die 201, FIG. 2) as the main and peaking amplifiers 120, 140 and the combining node structure 190. In an alternate embodiment, the input node 102 and power splitter 104 may be implemented in one or more components that are distinct from the IC die that includes the main and peaking amplifiers 120, 140 and the combining node structure 190. According to another further embodiment, the resistor-divider bias circuits 170, 170', 170" also are integrally- and monolithically-formed in the same IC die (e.g., die 201, FIG. 2) as the main and peaking amplifiers 120, 140 and the combining node structure 190, although biasing may be performed by non-integrated circuits and structures in other embodiments. According to yet another further embodiment, the VBW circuits 180, 180', 180" also are integrally- and monolithically-formed in the same IC die (e.g., die 201, FIG. 2) as the main and peaking amplifiers 120, 140 and the combining node structure 190, although the VBW circuits 180, 180', 180" may be implemented using non-integrated circuits and structures in other embodiments.

FIG. 2 is a top view of a Doherty power amplifier IC 200 (or "Doherty IC"), in accordance with an example embodiment. For enhanced understanding, FIG. 2 should be viewed simultaneously with FIG. 3, which is a side, cross-sectional view of the Doherty IC 200 of FIG. 2 along line 3-3. As used herein, the terms "integrated circuit die" and "IC die" mean a single, distinct semiconductor die (or semiconductor substrate) within which one or more circuit components (e.g., transistors, passive devices, and so on) are integrally-formed and/or directly physically connected to produce a monolithic structure.

Doherty IC 200 includes substantially an entire Doherty amplifier (e.g., Doherty amplifier 100, FIG. 1) integrally- and monolithically-formed in and on a single semiconductor die 201, where the semiconductor die has a substantially rectangular periphery defined by opposed input and output sides 210, 211 (e.g., bottom and top sides in the orientation of FIG. 2) and opposed left and right sides 212, 213 that extend between the input and output sides. In the specific embodiment illustrated in FIG. 2, Doherty amplifier IC 200 includes the following circuitry integrally- and monolithically-formed in and on semiconductor die 201: an input terminal 202 (e.g., input node 102, FIG. 1), a power splitter 204 (e.g., power splitter 104, FIG. 1), input phase delay circuits 209', 209" (e.g., input phase delay circuits 109', 109", FIG. 1), a two-stage main amplifier 220 (e.g., main amplifier 120, FIG. 1), a divided peaking amplifier consisting of first and second peaking amplifier portions 240', 240" (e.g., peaking amplifier portions 140', 140", FIG. 1), an output phase delay circuit 236 (e.g., output phase delay circuit 136, FIG. 1), a combining node structure 290 (e.g., combining node structure 190, FIG. 1), resistor-divider bias circuits 270, 270', 270" (e.g., resistor-divider bias circuits 170, 170', 170", FIG. 1), and VBW circuits 280, 280', 280" (e.g., VBW circuits 180, 180', 180", FIG. 1). In various alternate embodiments, one or more of the input terminal 202, power splitter 204, input phase delay circuits 209', 209", resistor-divider gate bias circuits 270, 270', 270", and/or VBW circuits 280, 280', 280" may be implemented using circuitry and/or on substrates that are physically distinct from the semiconductor die 201 in and on which the remaining portions of the Doherty amplifier are formed.

Figure 3:
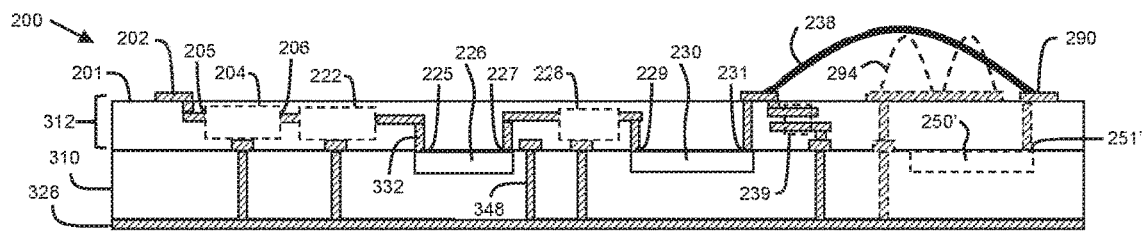
FIG. 3 is a side, cross-sectional view of the Doherty amplifier IC of FIG. 2 along line 3-3, in accordance with an example embodiment.

As seen most clearly in FIG. 3, the semiconductor die 201 includes a base semiconductor substrate 310 and a plurality of build-up layers 312 over a top surface of the base semiconductor substrate 310. In a particular example embodiment, the base semiconductor substrate 310 is a high-resistivity silicon substrate (e.g., a silicon substrate having bulk resistivity in a range of about 1000 ohm/centimeter (cm) to about 100,000 ohm/cm or greater). Alternatively, the base semiconductor substrate 310 may be a semi-insulating gallium arsenide (GaAs) substrate (e.g., a GaAs substrate having bulk resistivity up to $10^8$ ohm/cm), or another suitable high-resistivity substrate. In still other alternate embodiments, the base semiconductor substrate 310 may be any of multiple variants of a GaN substrate or other III-V semiconductor substrates.

Figure 6:
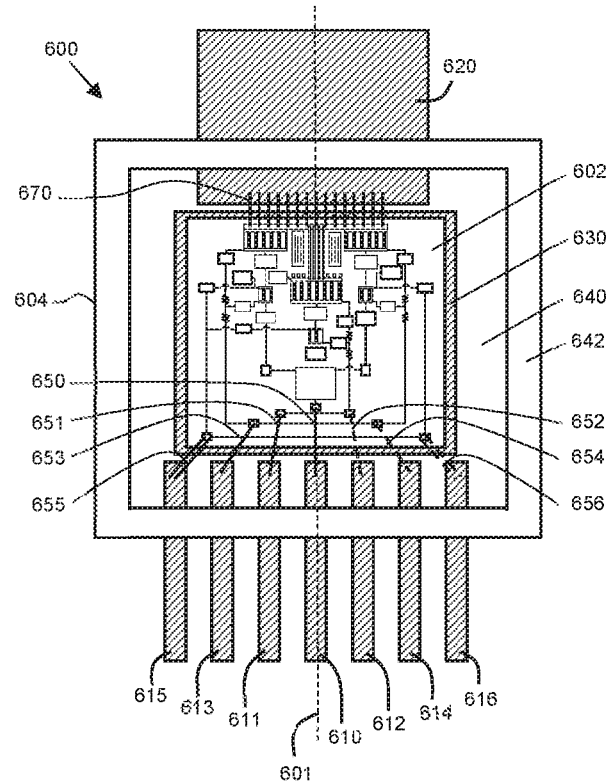
FIG. 6 is a top view of a Doherty amplifier device packaged in a high-power package, in accordance with an example embodiment.

The plurality of build-up layers 312 may include, for example, a plurality of interleaved dielectric layers, patterned conductive layers, and other conductive structures (e.g., conductive polysilicon structures). Portions of different patterned conductive layers and structures are electrically coupled with conductive vias (e.g., via 332). Further, conductive through substrate vias (TSVs) (e.g., TSV 348) may provide conductive paths between the top and bottom surfaces of the base semiconductor substrate 310. The TSVs may or may not be lined with dielectric material to insulate the TSVs from the base semiconductor substrate 310. According to an embodiment, a conductive layer 328 on the bottom surface of the base semiconductor substrate 310 functions as a ground node for the Doherty IC 200. Although not shown in FIG. 3, but as indicated in FIG. 6, when the Doherty IC 200 ultimately is packaged, the conductive layer 328 may be physically and electrically coupled to a ground node of a package substrate (e.g., flange 630, FIG. 6).

In the below description of the Doherty IC 200, reference will be made to various circuits that include capacitors, inductors, and/or resistors. The capacitors may be, for example, integrated metal-insulator-metal (MIM) capacitors (e.g., capacitor 239, FIGS. 2, 3) formed within the build-up layers 312, and/or small chip capacitors (discrete capacitors) coupled to the top surface of the die 201, in various embodiments. The resistors may be, for example, integrated resistors (e.g., formed from polysilicon within the build-up layers 312), or small discrete resistors coupled to the top surface of the die 201. The inductors may be integrated spiral inductors (e.g., formed from patterned conductive layers and vias within the build-up layers 312), or they may be discrete inductors or inductances formed from wirebonds or other inductive components.

In the embodiment of FIGS. 2 and 3, each of the main amplifier 220 and the peaking amplifier portions 240', 240" include a cascade arrangement of two power transistors, including a relatively low-power pre-amplifier transistor 226, 246', 246" (e.g., pre-amplifiers 126, 146', 146", FIG. 1) and a relatively high-power final-stage amplifier transistor 230, 250', 250" (e.g., final-stage amplifiers 130, 150', 150", FIG. 1). The description herein refers to each transistor as including a control terminal and two current-conducting terminals. For example, using terminology associated with FETs, a "control terminal" refers to a gate terminal of a transistor, and first and second current-conducting terminals refer to drain and source terminals (or vice versa) of a transistor. Although the below description may use terminology commonly used in conjunction with FET devices, the various embodiments are not limited to implementations the utilize FET devices, and instead are meant to apply also to implementations that utilize bipolar junction transistors (BJT) devices or other suitable types of transistors.

Each transistor 226, 246', 246", 230, 250', 250" includes a gate terminal 225, 229, 245', 245", 249', 249" (or control terminal), a drain terminal 227, 231, 247', 247", 251', 251" (or first current-carrying terminal), and a source terminal (or second current-carrying terminal), not numbered. In a specific embodiment, each transistor 226, 246', 246", 230, 250', 250" is an LDMOS FET, which includes an active area disposed between gate and drain terminals. Each active area includes a plurality of elongated, parallel-aligned, and interdigitated drain regions and source regions, where each drain region and each source region is a doped semiconductor region formed in the base semiconductor substrate 310. Due to their elongated shapes, each set of adjacent drain and source regions, along with an associated gate structure, may be referred to as a "transistor finger," and each transistor 226, 246', 246", 230, 250', 250" includes a plurality of parallel transistor fingers within the active area of the transistor (indicated with vertical lines in FIG. 2).

A variably-conductive channel (and, in some embodiments, a drain drift region) is present between adjacent source and drain regions. Conductive (e.g., polysilicon or metal) gate structures formed over the base semiconductor substrate 310 are coupled to and extend from each gate terminal 225, 229, 245', 245", 249', 249" over and along the channel regions. Similarly, additional conductive (e.g., polysilicon) drain structures formed over the base semiconductor substrate 310 are coupled to and extend from each drain terminal 227, 231, 247', 247", 251', 251" over and along the drain regions. The source regions are electrically coupled to conductive (e.g., polysilicon or metal) source contacts, which in turn are coupled to conductive TSVs (e.g., TSV 348, FIG. 3) that extend through the base semiconductor substrate 310 to connect with conductive layer 328 on the bottom surface of the base semiconductor substrate 310. Voltages applied to the gate terminals 225, 229, 245', 245", 249', 249" during operation modulate the conductivity of the variably-conductive channels, thus enabling current flow between source and drain regions (or ultimately between conductive layer 328 and each drain terminal 227, 231, 247', 247", 251', 251").

The circuitry integrated within and coupled to Doherty IC 200 will now be described in more detail. Referring again to FIG. 2, the input terminal 202 (e.g., input node 102, FIG. 1), which is configured to receive an input RF signal for amplification, is electrically connected to a splitter input 205 (e.g., input 105, FIG. 1) of power splitter 204 through a conductive path implemented in the build-up layers 312 of the Doherty IC 200. Input terminal 202 may include, for example, a conductive bondpad, which is exposed at the top surface of the die 201, and which is configured for attachment of one or more wirebonds (e.g., wirebond 650, FIG. 6). Alternatively, die 201 may be a flip-chip die or the input terminal may be exposed at the bottom surface of the die 201, in which case the input terminal 202 may consist of a conductive land or other type of connection. These alternate configurations also may apply to the other terminals (e.g., terminals 271-L, 271-R, 271'-L, 271'-R, 282-L, and 282-R) of the Doherty IC 200.

The power splitter 204 (e.g., power splitter 104, FIG. 1) is configured to divide the power of an input RF signal received at input terminal 205 into main and peaking portions of the input signal. As described in conjunction with FIG. 1, because the peaking amplifier is implemented using two peaking amplifier portions 240', 240", power splitter 204 is configured to divide the power of the input RF signal received at input terminal 202 into one main portion of the input signal and two peaking portions of the input signal.

The main input signal is produced at power splitter output 206 (e.g., output 106, FIG. 1), and the peaking input signals are produced at power splitter outputs 207 and 208 (e.g., outputs 107 and 108, FIG. 1). As also discussed previously, the power splitter 204 may divide the power equally or unequally, depending on the relative sizes of the main amplifier 220 and the peaking amplifier portions 240', 240". In the embodiment of FIG. 2, the sizes of the main amplifier 220 and the peaking amplifier portions 240', 240" are approximately equal (i.e., the three amplifiers 220, 240', 240" have a 1:1:1 size relationship, and the Doherty amplifier is an asymmetric amplifier with a 1:2 main-to-peaking ratio), and thus the power splitter 204 divides the input RF signal so that roughly one third of the input signal power is produced at each power splitter output 206-208. In other embodiments, the sizes of the main amplifier 220 and the peaking amplifier portions 240', 240" may be unequal, in which case the power splitter 204 may divide the power of the RF input signal into unequal portions.

Input terminal 205 has a 50 ohm input impedance, in an embodiment, although the input impedance may be less or greater than 50 ohms, as well. According to an embodiment, the power splitter 204 has a Wilkinson-based design, which essentially divides the power of the input signal received at input 205 into three signals with equal phase at outputs 206-208.

According to an embodiment, power splitter 204 is formed from passive components that are integrally-formed in and/or coupled to Doherty IC 200. In a more specific embodiment, power splitter 204 is a three-branch splitter, where each splitter branch (e.g., branches 401-403, 501-503, FIGS. 4, 5) has a multiple-section CLC (capacitor-inductor-capacitor) topology, as will be described in more detail later. Power splitter 204 may provide an advantage over conventional power splitters, in that the multiple-section topology of power splitter 204 may have a more broadband response than a conventional one-section power splitter.

Figure 4:
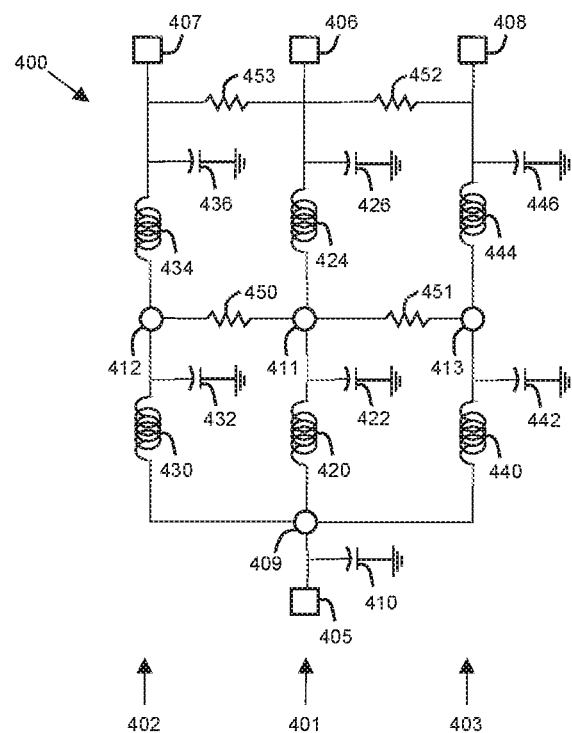
FIG. 4 is a simplified schematic of a signal splitter of a Doherty power amplifier, in accordance with an example embodiment.
Figure 5:
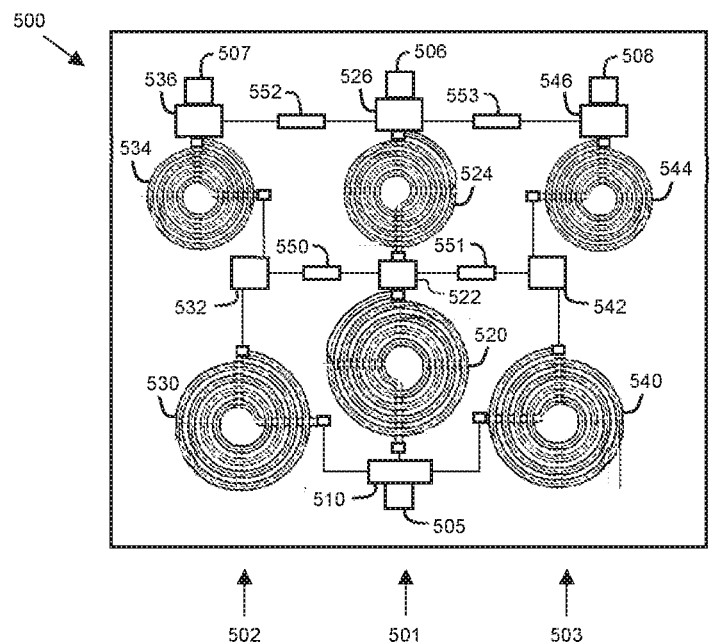
FIG. 5 is a top view of an integrated signal splitter suitable for integration in a Doherty power amplifier IC, in accordance with an example embodiment.

FIGS. 4 and 5, illustrate a simplified schematic and a top view, respectively, of an integrated signal splitter 400, 500 (e.g., splitter 104, 204, FIGS. 1, 2) suitable for use in Doherty IC 200, in accordance with an example embodiment. Splitter 400, 500 includes a splitter input terminal 405, 505 (e.g., input 105, 205, FIGS. 1, 2) configured to receive an input RF signal, and three splitter branches 401-403, 501-503 coupled between the input terminal 405, 505 and splitter output terminals 406, 506, 407, 507, 408, 508 (e.g., outputs 106-108, 206-208, FIGS. 1, 2).

As can be seen in FIGS. 4 and 5, splitter 400, 500 includes a plurality of capacitors, inductors, and resistors, in an embodiment. Each inductor (e.g., inductors 420, 430, 440, 520, 530, 540, FIGS. 4, 5) may be implemented, for example, as an integrated spiral inductor formed from patterned conductive layers and vias within the build-up layers of the die 201 (e.g., build-up layers 312, FIG. 3). In alternate embodiments, some or all of the inductors 420, 430, 440, 520, 530, 540 may be implemented as discrete inductors or wirebond arrays coupled to the top surface of the die 201. Each of the inductors 420, 430, 440, 520, 530, 540 may have an inductance value in a range of about 4 nanohenries (nH) to about 9 nH when a center frequency of operation, fo, of the Doherty IC 200 is about 2.0 gigahertz (GHz), although the center frequency of operation and/or the inductance values may be lower or higher, as well.

Each capacitor (e.g., capacitors 410, 422, 426, 432, 436, 442, 446, FIGS. 4, 5) may be an integrated MIM capacitor formed within the build-up layers of the die 201 (e.g., build-up layers 312, FIG. 3), and/or small chip capacitors (discrete capacitors) coupled to the top surface of the die 201, in various embodiments. According to an embodiment, each capacitor 410, 422, 426, 432, 436, 442, 446 is a shunt capacitor, with a bottom electrode coupled to a ground reference using TSVs that extend through the base semiconductor substrate (e.g., substrate 310, FIG. 3) to a conductive layer (e.g., layer 328, FIG. 3) on the bottom surface of the die 300. Each of the capacitors 410, 422, 426, 432, 436, 442, 446 may have a capacitance value in a range of about 0.5 picofarads (pF) to about 1.5 pF when a center frequency of operation of the amplifier is about 2.0 GHz, although the center frequency of operation and/or the capacitance values may be lower or higher, as well.

Power splitter 400, 500 also includes a plurality of resistors (e.g., resistors 450-453, 550-553, FIGS. 4, 5), in an embodiment, and as will be described in more detail below. The resistors 450-453, 550-553 may be, for example, integrated resistors (e.g., formed from polysilicon within the build-up layers 312, FIG. 3), or small discrete resistors coupled to the top surface of the die 201. Each of the resistors 450-453, 550-553 may have a resistance value in a range of about 50 ohms to about 250 ohms, although the resistance values may be lower or higher, as well.

Beginning at the splitter input terminal 405, 505, a first shunt capacitor 410, 510 is electrically coupled between the input terminal 405, 505 and a dividing node 409 for the three branches 401-403, 501-503. Each splitter branch 401-403, 501-503 is a two-section branch with two capacitor-inductor-capacitor (CLC) circuit sections coupled in series between the splitter input terminal 405, 505 and a splitter output terminal 406-408, 506-508. A first section of each branch 401-403, 501-503 includes a first CLC circuit section that is defined by the first shunt capacitor 410, 510, a first inductor 420, 520, 430, 530, 440, 540, and a second shunt capacitor 422, 522, 432, 532, 442, 542. Each first inductor 420, 520, 430, 530, 440, 540 has a first terminal coupled to the input terminal 405, 505 (or to dividing node 409), and a second terminal coupled to an inter-section node 411, 412, 413. Each second shunt capacitor 422, 522, 432, 532, 442, 542 is electrically coupled between an inter-section node 411, 412, 413 and the ground reference. A second section of each branch 401-403, 501-503 includes a second CLC circuit section that is defined by the second shunt capacitor 422, 522, 432, 532, 442, 542, a second inductor 424, 524, 434, 534, 444, 544, and a third shunt capacitor 426, 526, 436, 536, 446, 546. Each second inductor 424, 524, 434, 534, 444, 544 has a first terminal coupled to an inter-section node 411, 412, 413, and a second terminal coupled to an output terminal 406-408, 506-508. Each third shunt capacitor 426, 526, 436, 536, 446, 546 is electrically coupled between an output terminal 406-408, 506-508 and the ground reference. According to an embodiment, each first inductor 420, 520, 430, 530, 440, 540 is significantly larger (e.g., between about 10 percent and 100 percent larger) in inductance value than each second inductor 424, 524, 434, 534, 444, 544. In alternate embodiments, the first and second inductors may have substantially identical inductance values, or each second inductor 424, 524, 434, 534, 444, 544 may be significantly larger in inductance value than each first inductor 420, 520, 430, 530, 440, 540.

First inter-branch resistors 450, 550, 451, 551 are electrically coupled between inter-section nodes 411 and 412 and between inter-section nodes 411 and 413, and second inter-branch resistors 452, 552, 453, 553 are electrically coupled between output terminals 406 and 407 and between output terminals 406 and 408. The inter-branch resistors 450, 550, 451, 551 provide isolation between the branches 401-403, 501-503 of the power splitter 400, 500.

Although FIGS. 4 and 5 depict multiple-section splitters 400, 500 that include two splitter sections in each branch 401-403, 501-503, alternate embodiments may include more than two (e.g., three, four, or more) sections in each branch 401-403, 501-503. In addition, other alternate embodiments that include a single peaking amplifier may include only two branches (e.g., one branch for the main amplifier and one branch for the single peaking amplifier). Still other alternate embodiments that include more than two peaking amplifier portions (or more than one divided peaking amplifier) may include more than three branches (e.g., one branch for the main amplifier and one branch for each peaking amplifier or peaking amplifier portion). Although FIGS. 4 and 5 depict a particular integrated signal splitter configuration, other types or configurations of signal splitters may be used, in other embodiments. Referring again to FIG. 2, output 206 (e.g., output 406, 506, FIGS. 4, 5) of power splitter 204 is electrically connected to the input 221 of the main amplifier 220 through a conductive path implemented in the build-up layers 312 of the Doherty IC 200. According to an embodiment, outputs 207, 208 (e.g., outputs 407, 507, 408, 508, FIGS. 4, 5) of power splitter 204 are electrically connected to the inputs 241', 241" of the peaking amplifier portions 240', 240" through input phase delay circuits 209', 209" (e.g., input phase delay circuits 109', 109", FIG. 1) and additional conductive paths implemented in the build-up layers 312 of the Doherty IC 200. The input phase delay circuits 209', 209" are configured to ensure that the peaking input signals at the inputs 241', 241" to the peaking amplifier portions 240', 240" have about 90 degrees of phase difference from the main input signal at the input 221 to the main amplifier 220. According to an embodiment, each input phase delay circuit 209', 209" is implemented with integrated components, which as indicated by the circuit schematic next to circuit 209', may include a pi-configured phase delay circuit. For example, each phase delay circuit 209', 209" may include an integrated inductor with a first terminal coupled to an output 207, 208 of splitter 204, and a second terminal coupled to an input 241', 241" to a respective peaking amplifier portions 240', 240", along with integrated shunt capacitors coupled between each inductor terminal and the ground reference. In an alternate embodiment, the input phase delay circuits 209', 209" could be implemented using transmission lines (or wirebonds) having a suitable electrical length (e.g., about 90 degrees or a lesser amount that is sufficient to produce the desired phase delay at inputs 241', 241"), or using some other delay circuit structure or configuration.

Each of the main amplifier 220 and the peaking amplifier portions 240', 240" may have a substantially similar configuration, in an embodiment. According to an embodiment, each amplifier 220, 240', 240" is a two-stage amplifier, which includes a relatively low-power pre-amplifier 226, 246', 246" (or pre-amplifier FET) and a relatively high-power final-stage amplifier 230, 250', 250" (or final-stage amplifier FET) connected in a cascade arrangement between an amplifier input 221, 241', 241" and a combining node structure 290.

In the main amplifier 220, an input 221 of the amplifier 220 is coupled through an input impedance matching network 222 (e.g., IMN 122, FIG. 1) to an input terminal 225 (e.g., gate terminal) of pre-amplifier FET 226, an output 227 (e.g., drain terminal) of the pre-amplifier FET 226 is electrically coupled through an inter-stage impedance matching network 228 (e.g., ISMN 128, FIG. 1) to an input terminal 229 (e.g., gate terminal) of final-stage amplifier FET 230. Similarly, in each of the peaking amplifier portions 240', 240", an input 241', 241" of the amplifier 240', 240" is coupled through an input impedance matching network 242', 242" (e.g., IMNs 142', 142", FIG. 1) to an input terminal 245', 245" (e.g., gate terminal) of pre-amplifier FET 246', 246", an output 247', 247" (e.g., drain terminal) of the pre-amplifier FET 246', 246" is electrically coupled through an inter-stage impedance matching network 248', 248" (e.g., ISMN 148', 148", FIG. 1) to an input terminal 249', 249" (e.g., gate terminal) of final-stage amplifier FET 250', 250". The source terminals of each of FETs 226, 230, 246', 246", 250', 250" are electrically coupled to a ground reference (e.g., using TSVs through the base semiconductor substrate 310 to a bottom conductive layer 328, FIG. 3).

Each pre-amplifier FET 226, 246', 246" may be equal in size, in an embodiment, and may configured to apply a gain to a respective input RF signal in a range of about 15 decibels (dB) to about 25 dB when the Doherty IC 200 is operating in a high-power mode (e.g., close to compression), although only pre-amplifier FET 226 provides gain to its input signal when the Doherty IC 200 is operating in a low-power mode. The final-stage amplifier FETs 230, 250', 250" are significantly larger than the pre-amplifier FETs 226, 246', 246" (e.g., at least twice as large to apply at least twice the gain). Each final-stage amplifier FET 230, 250', 250" also may be equal in size, in an embodiment, and may be configured to apply a gain to a respective input RF signal in a range of about 15 dB to about 25 dB when the Doherty IC 200 is operating in a high-power mode (e.g., close to compression), although only final-stage amplifier FET 230 provides gain to its input signal when the Doherty IC 200 is operating in a low-power mode.

According to an embodiment, gate bias voltages for each of the FETs 226, 230, 246', 246", 250', 250" are provided through resistor-divider gate bias circuits 270, 270', 270" (e.g., resistor-divider gate bias circuits 170, 170', 170", FIG. 1). As indicated previously, for proper operation of Doherty amplifier IC 200, the main amplifier 220 is biased to operate in class AB mode, and the peaking amplifier portions 240', 240" typically are biased to operate in class C mode. In some configurations, the peaking amplifier portions 240', 240" may be biased to operate in class B or deep class B modes. Because the main amplifier 220 is biased differently from the peaking amplifier portions 240', 240", the main amplifier resistor-divider gate bias circuit 270 is distinct from (and not electrically connected to) the peaking amplifier resistor-divider gate bias circuits 270', 270". However, since the peaking amplifier portions 240', 240" are biased the same as each other, the peaking amplifier resistor-divider gate bias circuits 270', 270" may be identical and electrically connected together, as is shown in the embodiment of FIG. 2.

In the illustrated embodiment, the main amplifier resistor-divider gate bias circuit 270 includes a multi-point input terminal 271, resistors 273, 274, and RF isolation circuits 275, 276. Input terminal 271 includes electrically connected first and second (e.g., left (L) and right (R)) terminals 271-L and 271-R, in an embodiment. More specifically, the corresponding pair of terminals 271-L and 271-R are electrically connected together through a conductive path 272. The conductive path 272 may include one or more conductive traces formed from portions of one or more conductive layers of the build-up layers (e.g., build-up layers 312, FIG. 3), and that extend between the terminals 271-L, 271-R across a device bisection line (e.g., device bisection line 601, FIG. 6). The conductive path 272 also may include conductive vias in the build-up structure to interconnect the terminals 271-L, 271-R and the one or more conductive traces. According to an embodiment, the conductive path 272 is a relatively low-resistance conductive path that is devoid of discrete passive or active circuit components (e.g., inductors, resistors, capacitors, transistors, and so on). The conductive path 272 extends across at least 10 percent of a width (horizontal dimension in FIG. 2) of the device 200, in one embodiment, across at least 25 percent of the device width, in another embodiment, and across at least 50 percent of the device width, in yet another embodiment. Each of terminals 271-L and 271-R may include a conductive bondpad that is exposed at the top surface of the die 201, and which is configured for attachment of one or more wirebonds (e.g., wirebond 651 and/or 652, FIG. 6). As will be better understood later in conjunction with the description of FIG. 6, the inclusion of electrically-connected left and right input terminals 271-L and 271-R enables a main amplifier input bias voltage to be supplied through either or both of two main amplifier bias leads (e.g., lead 611 and/or lead 612, FIG. 6) that are located to the left and to the right, respectively, of the device bisection line (e.g., device bisection line 601, FIG. 6). This feature provides increased design flexibility for packaging Doherty amplifier IC 200 and/or for configuring a printed circuit board (PCB) (e.g., PCB 710, FIG. 7) on which such a packaged Doherty amplifier IC is coupled. In an alternate embodiment, the input terminal 271 may include only a single conductive bond pad.

Resistors 273, 274 are electrically connected in series between input terminal 271 and a ground reference. The first resistor 273 has a first terminal electrically coupled to the input terminal 271 and to the gate terminal 225 of the pre-amplifier FET 226. A node between input terminal 271 and resistor 273 is electrically connected to the gate terminal 225 of the pre-amplifier FET 226, and an intermediate node (between resistors 273, 274) is electrically connected to the gate terminal 229 of final-state amplifier FET 230. The resistance values of resistors 273, 274 are selected to divide the main pre-amplifier gate bias DC voltage supplied at input terminal 271 (or at gate terminal 225) into fractions, so that a desired DC bias voltage is provided at gate terminal 229. For example, resistors 273, 274 may have equal or unequal resistance values in a range of about 500 ohms to about 10,000 ohms, although resistors 273, 274 may have lower or higher resistance values, as well.

To ensure that a significant amount of RF power is not lost through the bias circuit 270, main amplifier 220 is de-coupled (or isolated) from the bias circuit 270 with RF isolation circuits 275, 276. More specifically, RF isolation circuit 275 is electrically coupled between the input terminal 271 and gate terminal 225, and RF isolation circuit 276 is electrically coupled between resistor 273 and gate terminal 229. According to an embodiment, each RF isolation circuit 275, 276 includes an integrated, lumped-element equivalent of a quarter wave (lambda/4) transmission line, with a reactive component that resonates at the center frequency of operation of the amplifier 200. Ideally, using this configuration, the bias circuit 270 emulates infinite impedance at frequencies near the center frequency of operation, thus isolating the bias circuit 270 at those frequencies.

The peaking amplifier resistor-divider gate bias circuits 270', 270" each include a multi-point input terminal 271', resistors 273', 273", 274', 274" and RF isolation circuits 275', 275", 276', 276". Input terminal 271' includes electrically connected first and second (e.g., left (L) and right (R)) terminals 271'-L and 271'-R, in an embodiment. As mentioned above, since the peaking amplifier portions 240', 240" may be biased the same, input terminals 271'-L and 271'-R may be electrically connected, and to provide packaging and device mounting flexibility, they may be located to the left and to the right, respectively, of the device bisection line (e.g., device bisection line 601, FIG. 6). More specifically, the corresponding pair of terminals 271'-L and 271'-R are electrically connected together through a conductive path 272'. The conductive path 272' may include one or more conductive traces formed from portions of one or more conductive layers of the build-up layers (e.g., build-up layers 312, FIG. 3), and that extend between the terminals 271'-L and 271'-R across a device bisection line (e.g., device bisection line 601, FIG. 6). The conductive path 272' also may include conductive vias in the build-up structure to interconnect the terminals 271'-L and 271'-R and the one or more conductive traces. According to an embodiment, the conductive path 272' is a relatively low-resistance conductive path that is devoid of discrete passive or active circuit components (e.g., inductors, resistors, capacitors, transistors, and so on). The conductive path 272' extends across at least 10 percent of the device width, in one embodiment, across at least 25 percent of the device width, in another embodiment, and across at least 50 percent of the device width, in yet another embodiment. Again, each of input terminals 271'-L and 271'-R may include a conductive bondpad that is exposed at the top surface of the die 201, and which is configured for attachment of one or more wirebonds (e.g., wirebond 653 and/or 654, FIG. 6). In alternate embodiments, the input terminals 271'-L and 271'-R may be electrically isolated from each other, or a single input terminal may replace the two input terminals 271'-L and 271'-R.

Resistors 273', 274' are electrically connected in series between input terminal 271'-L and a ground reference. The first resistor 273' has a first terminal electrically coupled to the input terminal 271' and to the gate terminal 245' of the pre-amplifier FET 246'. A node between input terminal 271'-L and resistor 273' is electrically connected to the gate terminal 245' of the pre-amplifier FET 246', and an intermediate node (between resistors 273', 274') is electrically connected to the gate terminal 249' of final-stage amplifier FET 250'. Similarly, resistors 273", 274" are electrically connected in series between input terminal 271'-R and a ground reference. The first resistor 273" has a first terminal electrically coupled to the input terminal 271' and to the gate terminal 245" of the pre-amplifier FET 246". A node between input terminal 271'-R and resistor 273" is electrically connected to the gate terminal 245" of the pre-amplifier FET 246", and an intermediate node (between resistors 273", 274") is electrically connected to the gate terminal 249" of final-stage amplifier FET 250". The resistance values of resistors 273', 273", 274', 274" are selected to divide the peaking pre-amplifier gate bias DC voltage supplied at input terminal 271'-L, 271'-R (or at gate terminals 245', 245") into fractions, so that a desired DC bias voltage is provided at gate terminals 249', 249". For example, resistors 273', 274' and 273", 274" may have equal or unequal resistance values in a range of about 1000 ohms to about 10,000 ohms, although resistors 273', 273", 274', 274" may have lower or higher resistance values, as well.

Again, to ensure that a significant amount of RF power is not lost through the bias circuits 270', 270", peaking amplifier portions 240', 240" are de-coupled (or isolated) from the bias circuits 270', 270" with RF isolation circuits 275', 275", 276', 276". More specifically, RF isolation circuits 275', 275" are electrically coupled between the input terminal 271' and gate terminals 245', 245", and RF isolation circuits 276', 276" are electrically coupled between resistors 273', 273" and gate terminals 249', 249". Again, each RF isolation circuit 275', 275", 276', 276" may include an integrated, lumped-element equivalent of a quarter wave (lambda/4) transmission line, with a reactive component that resonates at the center frequency of operation.

In addition to the gate bias circuits 270, 270', 270", Doherty amplifier IC 200 also may include one or more drain bias circuits 282. According to an embodiment, a drain bias circuit 282 includes a multi-point input terminal 284 and RF isolation circuits 286, 286', 286". Input terminal 284 includes electrically connected left and right terminals 284-L and 284-R on opposite sides of a device bisection line (e.g., device bisection line 601, FIG. 6), in an embodiment. More specifically, the corresponding pair of terminals 284-L and 284-R are electrically connected together through a conductive path 285. The conductive path 285 may include one or more conductive traces formed from portions of one or more conductive layers of the build-up layers (e.g., build-up layers 312, FIG. 3), and that extend between the terminals 284-L, 284-R across a device bisection line (e.g., device bisection line 601, FIG. 6). The conductive path 285 also may include conductive vias in the build-up structure to interconnect the terminals 284-L, 284-R and the one or more conductive traces. According to an embodiment, the conductive path 285 is a relatively low-resistance conductive path that is devoid of discrete passive or active circuit components (e.g., inductors, resistors, capacitors, transistors, and so on). The conductive path 285 extends across at least 10 percent of the device width, in one embodiment, across at least 25 percent of the device width, in another embodiment, and across at least 50 percent of the device width, in yet another embodiment. Again, each of terminals 284-L and 284-R may include a conductive bondpad that is exposed at the top surface of the die 201, and which is configured for attachment of one or more wirebonds (e.g., wirebond 655 and/or 656, FIG. 6).

The input terminal 284 is electrically connected to the drain terminals 227, 247', 247" of each of the pre-amplifier FETs 226, 246', 246", in an embodiment, to supply the same DC drain bias voltages to each FET 226, 246', 246". Again, to ensure that a significant amount of RF power is not lost through the bias circuit 282, main amplifier 220 and peaking amplifier portions 240', 240" are de-coupled (or isolated) from the bias circuit 282 with RF isolation circuits 286, 286', 286". More specifically, each RF isolation circuit 286, 286', 286" is electrically coupled between the input terminal 284 and a drain terminal 227, 247', 247" of a pre-amplifier FET 226, 246', 246". Again, each RF isolation circuit 286, 286', 286" may include an integrated, lumped-element equivalent of a quarter wave (lambda/4) transmission line, with a reactive component that resonates at the center frequency of operation. It should be noted that drain bias voltages may be supplied to final-stage amplifier FETs 230, 250', 250" through one or more device output leads (e.g., output lead 620, FIG. 6) and a connection (e.g., wirebonds 670, FIG. 6) between the device output lead and combining structure 290, in an embodiment.

As indicated previously, embodiments of Doherty amplifier IC 200 also may include one or more video bandwidth (VBW) circuits 280, 280', 280" (e.g., VBW circuits 180, 180', 180", FIG. 1) coupled between each amplification path and a ground reference. In the embodiment illustrated in FIG. 2, each VBW circuit 280, 280', 280" is electrically coupled to a node in the inter-stage portion of each amplification path (e.g., between the drain terminal 227, 247', 247" of a pre-amplifier FET 226, 246', 246" and the gate terminal 229, 249', 249" of a final-stage amplifier FET 230,

250', 250"). According to an embodiment, each VBW circuit 280, 280', 280" includes a series circuit of a resistor, an inductor, and a capacitor coupled between the inter-stage node and the ground reference. In other embodiments, a VBW circuit 280, 280', 280" may be coupled between the drain terminal 231, 251', 251" of a final-stage amplifier FET 230, 250', 250" and a ground reference, or a VBW circuit 280, 280', 280" may be coupled between the gate terminal 225, 245', 245" of a pre-amplifier FET 226, 246', 246" and the ground reference. Multiple VBW circuits may be coupled along multiple points of each amplification path, as well. Further still, in other embodiments, all or portions of a VBW circuit 280, 280', 280" may be provided by external circuitry (i.e., portions of the VBW circuits 280, 280', 280" may be provided with circuitry that is not integrally formed with die 201).

The outputs (i.e., drain terminals 231, 251', 251") of each of the final-stage amplifier FETs 230, 250', 250" are electrically connected to combining node structure 290 (e.g., combining node structure 190, FIG. 1), which functions to combine the amplified RF signals produced by each of the final-stage amplifier FETs 230, 250', 250" into a single amplified output RF signal.

Combining node structure 290 includes an elongated conductive bondpad that is exposed at the top surface of die 201. According to an embodiment, the length of the combining node structure 290 extends from the outside end 252' of the drain terminal 251' of peaking amplifier final stage FET 250' to the outside end 252" of the drain terminal 251" of peaking amplifier final stage FET 250". As illustrated in FIG. 2, combining node structure 290 has three sections, including a leftmost section that is electrically connected to the drain terminal 251' of peaking amplifier final-stage FET 250', a central section that is electrically connected (through wirebonds 238) to the drain terminal 231 of main amplifier final-stage FET 230, and a rightmost section that is electrically connected to the drain terminal 251" of peaking amplifier final-stage FET 250". According to an embodiment, the combining node structure 290 is a continuous conductive bondpad, although the combining node structure 290 could include discontinuous but electrically connected sections, as well. Desirably, the drain terminals 251', 251" are connected to the combining node structure 290 with conductive paths having a negligible phase delay (i.e., as close to zero degrees of phase delay as possible, such as 10 degrees or less of phase delay), and in some embodiments, the drain terminals 251', 251" may be integrally formed portions of the combining node structure 290. In other words, the drain terminal manifold of the peaking amplifier final-stage FETs 250', 250" may form portions of the combining node structure 290, in some embodiments. As mentioned previously, base semiconductor substrate 310 is a high-resistivity substrate, and therefore potentially high losses that might otherwise occur with a relatively long transmission line (such as combining node structure 290) on a relatively low-resistivity substrate are significantly reduced in Doherty amplifier IC 200.

As mentioned previously, to compensate for the 90 degree phase delay difference between the main and peaking amplification paths at the inputs of amplifiers 220, 240', 240" (i.e., to ensure that the amplified signals are combined in phase at the combining node structure 290), an output phase delay circuit 236 (e.g., circuit 136, FIG. 1) is electrically coupled between the output (i.e., drain terminal 231) of the main amplifier final-stage FET 230 and the outputs (i.e., drain terminals 251', 251") of the peaking amplifier final-stage FETs 250', 250". Specifically, the output phase delay circuit 236 is configured to result in a phase difference that is substantially equal to 90 degrees (i.e., 90 degrees+/−10 degrees) between an RF signal at the drain terminal 231 of the main amplifier final-stage FET 230 and RF signals at the drain terminals 251', 251" of the peaking amplifier final stage FETs 250', 250".

According to an embodiment, the output phase delay circuit 236 has a CLC (capacitance-inductance-capacitance) topology between drain terminal 231 and drain terminals 251', 251".

The first (shunt) capacitance includes the drain-source capacitance, $C_{dsM}$, of the main amplifier final-stage FET 230, plus additional capacitance provided by a plurality of relatively small, integrated shunt capacitors 239 (e.g., MIM capacitors) that are electrically coupled in parallel with $C_{dsM}$, between the main amplifier final-stage FET drain terminal 231 and the die ground reference (e.g., conductive layer 328, FIG. 3). Capacitors 239 may be distributed along the drain terminal 231, as shown in FIG. 2, although capacitors 239 may be located elsewhere, as well. Desirably, for a symmetrical Doherty amplifier, the capacitance of capacitors 239 is selected so that the combined capacitance of $C_{dsM}$ and capacitors 239 is approximately equal to the combined drain-source capacitances, $C_{dsP}$, of the peaking amplifier final-stage FETs 250', 250". For an asymmetrical Doherty amplifier, such as that illustrated in FIG. 2, the drain-source capacitance, $C_{dsM}$, of the main amplifier final-stage FET 230 may be designed to be lower than the combined drain-source capacitances, $C_{dsP}$, of the peaking amplifier final-stage FETs 250', 250". In an asymmetrical Doherty amplifier embodiment, the combined capacitance of $C_{dsM}$ and capacitors 239 should be designed as follows: 1) so that the transmission path (or "pseudo-transmission line") between the main amplifier final-stage FET 230 and the peaking amplifier final-stage FETs 250', 250" provides about a 90 degree phase shift at the center frequency of operation, and 2) so that:

$$L_D = \frac{1}{(2*\pi*freq)^2 * C_{DS}}$$

$$Z_C = \sqrt{\frac{L_D}{C_{DS}}},$$

where freq is the center frequency of operation, $L_D$ is the inductance of the conductive path between the drain terminal 231 of the main amplifier final-stage FET 230 and the drain terminals 251', 251" of the peaking amplifier final-stage FETs 250', 250", $C_{DS}$ is the output capacitance of the main amplifier final-stage FET 230 and/or the peaking amplifier final-stage FETs 250', 250", and $Z_C$ is the characteristic impedance of the pseudo-transmission line between the drain terminal 231 of the main amplifier final-stage FET 230 and the drain terminals 251', 251" of the peaking amplifier final-stage FETs 250', 250". As will be described in more detail later, a portion of For example, the parallel combination of $C_{dsM}$ and capacitors 239 have a combined capacitance value in a range of about 3 pF to about 10 pF (e.g., about 5 pF to about 6 pF) at a center frequency of operation of about 2.0 GHz, in an embodiment, although the center frequency of operation and/or the combined capacitance could be lower or higher, as well. Although six capacitors 239 are shown in FIG. 2, more or fewer capacitors 239 may be utilized, in other embodiments.

A plurality of wirebonds 238 are electrically connected between the drain terminal 231 of the main amplifier final-stage FET 230 and combining node structure 290. More specifically, first ends of the wirebonds 238 are connected to the drain terminal 231, and second ends of the wirebonds 238 are connected to the combining node structure 290. The inductance in the CLC topology of the output phase delay circuit 236 is provided by the series combination of wirebonds 238 and portions of the combining node structure 290 that extend between the landing points of the wirebonds 238 on the structure 290 and the drain terminals 251', 251" of the peaking amplifier final-stage FETs 250', 250". According to an embodiment, the series combination of the wirebonds 238 and those portions of the combining node structure 290 have a combined inductance in a range of about 0.8 nH to about 1.2 nH at a center frequency of operation of about 2.0 GHz, although the center frequency and/or the combined inductance could be lower or higher, as well.

Finally, the second (shunt) capacitance in the CLC topology of the output phase delay circuit 236 approximately equals the combined drain-source capacitances, $C_{dsP}$, of the peaking amplifier final-stage FETs 250', 250" minus a portion of $C_{dsP}$ that is compensated for by a shunt inductance (e.g., shunt inductor 750, FIG. 7), as will be explained in more detail in conjunction with FIG. 7. In other words, the second shunt capacitance may be represented by $A \times C_{dsP}$, where A<1.0, and $(1.0-A) \times C_{dsP}$ is equivalent to a negative capacitance provided by a compensating shunt inductance (e.g., shunt inductor 750, FIG. 7). The $C_{dsP}$ capacitances have a total combined capacitance value in a range of about 5 pF to about 10 pF (e.g., about 7 pF to about 8 pF) at a center frequency of operation of about 2.0 GHz, in an embodiment, although the center frequency and/or the capacitance could be lower or higher, as well.

To summarize, the 90 degree phase difference between drain terminal 231 and drain terminals 251', 251" is provided by an output phase delay circuit 236 with a CLC topology, where that topology includes a first shunt capacitance (provided by $C_{dsM}$ and capacitors 239), a series inductance (provided by wirebonds 238 and portions of combining node structure 290), and a second shunt capacitance (provided by $A \times C_{dsP}$, where A<1.0).

According to an embodiment, Doherty amplifier IC 200 also includes isolation structures 292 positioned between wirebonds 238 and peaking amplifier final-stage FETs 250', 250". The isolation structures 292 are configured to short the electromagnetic fields emanating from the wirebonds 238 during operation from the peaking amplifier final-stage FETs 250', 250". According to an embodiment, the isolation structures 292 each include a plurality of wirebonds 294, each of which launch and land on the surface of the die 201 (e.g., on a grounded conductive pad on the top surface of the die 201). The plurality of wirebonds can be arranged in rows, for example, as shown in FIG. 2, where each isolation structure 292 includes three rows of wirebonds 294, with two or three aligned wirebonds 294 in each row. As can be seen most clearly in FIG. 3, the wirebonds 238 of the isolation structures 292 (shown using dashed lines in FIG. 3) can have heights that are approximately equal to the height of wirebonds 238.

Doherty power amplifier IC 200 may be packaged and/or incorporated into a larger electrical system in a variety of ways. For example, Doherty IC 200 may be packaged within an overmolded or air-cavity power device package (e.g., package 604, FIG. 6). Alternatively, Doherty IC 200 may be packaged in a surface-mount type of package, such as a no-leads package (e.g., a dual-flat no leads (DFN) or quad-flat no leads (QFN) package). In still other embodiments, Doherty IC 200 may be mounted directly to a module or PCB substrate surface.

By way of example, FIG. 6 is a top view of a Doherty amplifier device 600 that includes a Doherty IC 602 (e.g., Doherty IC 200, FIG. 2) packaged in a high-power, discrete device package 604, in accordance with an example embodiment. Package 604 includes a plurality of conductive input signal and bias leads 610-616 and at least one output lead 620. The input signal and bias leads 610-616 are positioned at an input side of the package 604, and the at least one output lead 620 is positioned at an output side of the package 604. The input side (e.g., input side 210, FIG. 2) of the Doherty IC die 602 is proximate to and parallel with the input side of the device package 604, in an embodiment.

According to an embodiment, the bias leads 611-616 are symmetrically arranged on opposite sides of a device bisection line 601. According to an embodiment, the device bisection line 601 extends between the opposed input and output sides of the Doherty IC 602 (and between opposed input and output sides of the package 604) to divide the Doherty IC 602 and the device package 604 into two portions (e.g., a left portion and a right portion). The left and right portions of the Doherty IC 602 may be essentially equal in size, or they may be unequal. In some embodiments, the device bisection line 601 extends through the RF input terminal (e.g., input terminal 202, FIG. 2) and through the RF output terminal (e.g., combining node structure 290, FIG. 2). In addition, package 604 includes a package substrate, such as a conductive flange 630, to which Doherty IC 602 is physically and electrically connected (e.g., with conductive epoxy, solder, brazing, sintering, or other conductive connection methods). Finally, package 604 includes non-conductive structural features or materials, such as molding compound and/or other insulating materials, which hold the leads 610-616, 620 and the flange 630 in fixed orientations with respect to each other.

Electrically conductive connections, such as conductive wirebonds 650-656, electrically connect input signal and bias voltage bond pads (or terminals) on die 602 to conductive leads 610-616 on an input side of the device 600. For example, one or more first wirebonds 650 may electrically connect an input RF signal lead 610 to a first bondpad corresponding to an input terminal (e.g., input terminal 202, FIG. 2), and the input RF signal lead 610 may be used to convey an input RF signal to the Doherty IC 602.

As discussed previously in conjunction with FIG. 2, bias circuits (e.g., bias circuits 270, 270', 270", 282, FIG. 2) on Doherty IC 602 may have multi-point input terminals with electrically connected first and second, or left (L) and right (R) terminals (e.g., 271-L/271-R, 271'-L/271'-R, and 284-L/284-R, FIG. 2). When coupled to device package 604, the first (e.g., left) terminals (e.g., terminals 271-L, 271-L', 284-L, FIG. 2) are positioned to one side (e.g., to the left) of bisection line 601, and the second (e.g., right) terminals (e.g., terminals 271-R, 271'-R, 284-R, FIG. 2) are positioned to the other side (e.g., to the right) of bisection line 601. As described previously, corresponding pairs of left and right terminals are electrically connected together through a conductive path (e.g., conductive path 272, 272', 285, FIG. 2). With this configuration, an electrical connection may be made to each bias circuit input terminal through a bias lead 611, 613, 615 that is left of the bisection line 601, through a bias lead 612, 614, 616 that is right of the bisection line 601, or through bias leads both to the left and to the right of bisection line 601. Accordingly, when Doherty amplifier device 600 is attached to a system substrate (e.g., PCB 710, FIG. 7), bias voltage connections may be made from the left, from the right, or both from the left and the right of the device bisection line 601. This feature provides increased design flexibility for the system substrates to which Doherty amplifier device 600 is connected.

To make the bias connections, one or more second wirebonds 651 and/or 652 are used to electrically connect one or more main amplifier gate bias leads 611 and/or 612 to second and/or third bondpads corresponding to left and right terminals (e.g., terminals 271-L, 271-R, FIG. 2), respectively, of a main amplifier gate bias circuit (e.g., gate bias circuit 270, FIG. 2). Similarly, one or more third wirebonds 653 and/or 654 are used to electrically connect one or more peaking amplifier gate bias leads 613 and/or 614 to fourth and/or fifth bondpads corresponding to left and right terminals (e.g., terminals 271'-L, 271'-R, FIG. 2), respectively, of peaking amplifier gate bias circuits (e.g., gate bias circuits 270', 270'', FIG. 2). Finally, one or more fourth wirebonds 655 and/or 656 are used to electrically connect one or more drain bias leads 615 and/or 616 to sixth and/or seventh bondpads corresponding to left and right terminals (e.g., terminals 284-L, 284-R, FIG. 2), respectively, of a drain bias circuit (e.g., drain bias circuit 282, FIG. 2).

According to an embodiment, the output of Doherty IC 602 (and more specifically the combining node structure 290, FIG. 2) is electrically connected to the output lead 620 through a plurality of wirebonds 670. According to an embodiment, package 604 is designed so that die 602, and more specifically the combining node structure of die 602, may be positioned very close to output lead 620 when die 602 is coupled to package 604. Accordingly, wirebonds 670 may be relatively short. In addition, the number of wirebonds 670 may be selected to be relatively large (e.g., 20-40 wirebonds, more or less), which renders wirebonds 670 a relatively low parasitic inductive element. According to an embodiment, wirebonds 670 have an inductance value in a range of about 20 pH to about 70 pH (e.g., about 60 pH) although the inductance value may be smaller or larger, as well. Desirably, wirebonds 670 are designed so that the inductance value of wirebonds 670 is as low as possible.

In some embodiments, leads 610-616, 620 and flange 630 may form portions of a lead frame. To complete an overmolded package during device manufacturing, after attachment of die 602 and wirebonds 650-656, 670, the die 602, the interior ends of leads 610-616, 620, wirebonds 650-656, 670, and the upper and side surfaces of flange 630 may be encapsulated with a non-conductive (e.g., plastic) molding compound 640, 642 (only partially shown in FIG. 6 to avoid obscuring the interior components of device 600). The molding compound 640, 642 defines the perimeter of the device 600 from which leads 610-616, 620 protrude, and also defines the top surface of the device 600. The bottom surface of the device 600 is defined partially by the molding compound 640, and partially by the bottom surface of flange 630. Accordingly, when appropriately coupled to a system substrate (e.g., PCB 710, FIG. 7), flange 630 may function to convey a ground reference to the die 602 (e.g., through the bottom conductive layer 328, FIG. 3), and also may function as a heat sink for the device 600.

In a similar but different embodiment, leads 610-616, 620 with the configurations shown in FIG. 6 may be replaced with lands of a no-leads package. The flange 630 and lands again may form a lead frame to which the die 602 and wirebonds 650-656, 670 are attached, and again the assembly may be encapsulated with a non-conductive molding compound to form a no-leads, surface mount device (e.g., a DFN or QFN device).

In other embodiments, package 604 may be an air-cavity package. In such an embodiment, flange 630 may have a larger perimeter, which is equal or approximately equal to the perimeter of the device 600. A non-conductive insulator (e.g., ceramic, plastic, or another material) with a frame shape may be attached to the top surface of the flange, leads 610-616, 620 may be placed over the non-conductive insulator, wirebonds 650-656, 670 are attached, and a cap (not illustrated) is placed over the frame opening to encase the interior components of the device 600 in an air cavity.

Ultimately, Doherty amplifier device 600 is incorporated into a larger electrical system (e.g., a power transmitter lineup in a cellular base station). For example, as illustrated in FIG. 7, a Doherty amplifier device 720 (e.g., device 600, FIG. 6) may be incorporated into amplifier system 700.

Amplifier system 700 includes a single-layer or multi-layer PCB 710, and a plurality of elements coupled to the PCB 710, in an embodiment. For example, the amplifier system 700 may include a conductive coin 715 (or other feature) that is exposed at top and bottom surfaces of the PCB 710, and a Doherty amplifier device 720 (e.g., device 600, FIG. 6) connected to the conductive coin 715. More specifically, the bottom surface (e.g., the bottom of flange 630, FIG. 6) of the Doherty amplifier device 720 may be physically and electrically connected to the top surface of the conductive coin 715. The conductive coin 715, in turn, may be electrically connected to system ground, and a bottom surface of the coin 715 may be connected to a system heat sink. Accordingly, the conductive coin 715 may function as a ground reference and a heat sink for the amplifier system 700.

In a typical configuration, the amplifier system 700 includes an input RF connector 701 and an output RF connector 702, which are configured, respectively, to receive an input RF signal from an RF signal source, and to produce an amplified output RF signal for transmission (e.g., via a cellular antenna coupled to connector 702). One or more bias voltage connectors 703, 704 may be used to receive DC bias voltages from one or more voltage sources.

In addition, the amplifier system 700 includes a plurality of conductive paths and features 730-736 that are electrically coupled between the connectors 701-703 and the Doherty amplifier device 720. The conductive paths and features 730-736 may be formed from patterned portions of a top conductive layer, a bottom conductive layer, and/or interior conductive layer(s) (if included) of the PCB 710.

A first conductive path 730 electrically connects the input RF connector 701 to an input RF signal lead 722 (e.g., lead 610, FIG. 6) of the Doherty amplifier device 720. An input RF signal received by input RF connector 701 is conveyed to the input RF signal lead 722 through the first conductive path 730 during operation of the system 700. Similarly, a second conductive path 731 electrically connects the output RF connector 702 to an output RF signal lead 728 (e.g., lead 620, FIG. 6) of the Doherty amplifier device 720. An amplified RF signal produced by the Doherty amplifier device 720 is conveyed to the output RF connector 702 through the second conductive path 731 during operation of the system 700.

Additional conductive paths 732, 733, 734 electrically connect the bias voltage connector 703 to a plurality of bias voltage leads 724 (e.g., leads 611, 613, 615, FIG. 6) on a first side of the Doherty amplifier device 720 (e.g., left of bisection line 601 of device 600, FIG. 6). A plurality of drain and gate DC bias voltages are conveyed to the bias voltage leads 724 through conductive paths 732-734 during operation of the system 700. As explained in more detail previously in conjunction with FIG. 6, the bias circuit inputs (e.g., inputs 271, 271', 284, FIG. 2) of the Doherty IC (e.g., Doherty IC 200, FIG. 2) within Doherty amplifier device 720 may be designed so that additional or alternative conductive paths 732', 733', 734' and an additional or alternative bias voltage connector 703' may additionally or alternatively be used to provide drain and gate bias voltages to bias voltage leads 726 on a second side of the Doherty amplifier device 720 (e.g., right of bisection line 601 of device 600, FIG. 6). On the output side, a conductive path 735 electrically connects the bias voltage connector 704 to the output RF signal lead 728 (e.g., either directly or through path 731, as shown in FIG. 7). A drain DC bias voltage for the final-stage amplifiers is conveyed to the output RF signal lead 728 through bias voltage connector 704, conductive path 735, and output RF signal lead 728 during operation of the system 700.

According to an embodiment, amplifier system 700 also includes a shunt inductor 750, which is electrically coupled between the output RF signal lead 728 and an additional conductive feature 736. The shunt inductor 750 may be a discrete inductor, for example, which has a first terminal coupled to the output RF signal lead 728 (e.g., either directly or through path 731, as shown in FIG. 7), and a second terminal coupled to the conductive feature 736, which in turn is electrically coupled to system ground. The shunt inductor 750 is configured to at least partially absorb the drain source capacitance of the peaking amplifier final-stage transistor(s) (e.g., drain-source capacitances, $C_{dsP}$, of the peaking amplifier final-stage FETs 250', 250", FIG. 2), in an embodiment. In an alternate embodiment, all or a portion of the shunt inductance provided by shunt inductor 750 instead may be provided by designing an optimized conductive path 735 between the bias voltage connector 704 and the output RF signal lead 728, in which case shunt inductor 750 may be omitted. Although conventional asymmetric Doherty amplifier systems may include a shunt inductance for this purpose, the shunt inductance typically needs to be implemented inside the amplifier package (e.g., inside device 720). However, the relatively low inductance of the output wirebonds (e.g., wirebonds 670, FIG. 6) enables the shunt inductance to be moved outside of the amplifier package, in accordance with various embodiments. This may enable the amplifier package size to be decreased, while also facilitating easier tuning of the system 700, since the shunt inductor 750 size can be modified without requiring a re-design of the Doherty amplifier device 720.

Figure 7:
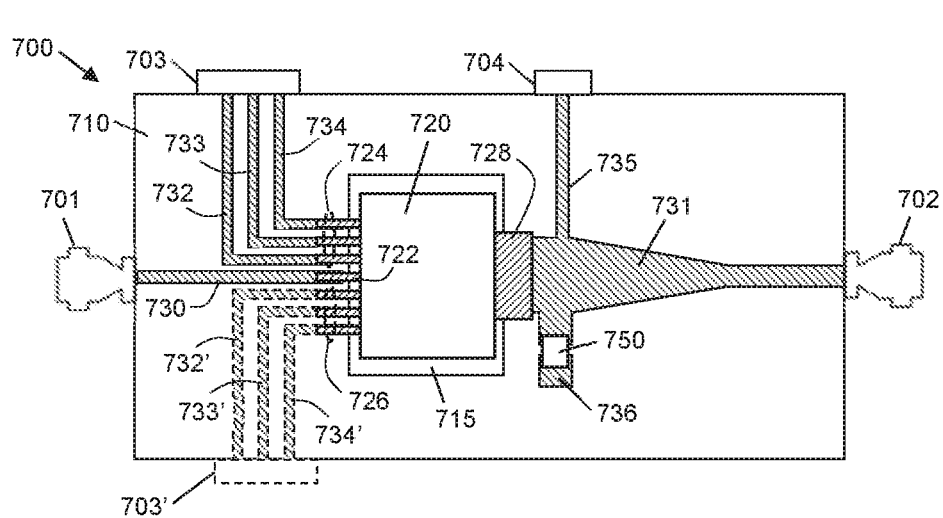
FIG. 7 is a top view of a packaged Doherty amplifier device coupled to a printed circuit board substrate, in accordance with an example embodiment.
Figure 8:
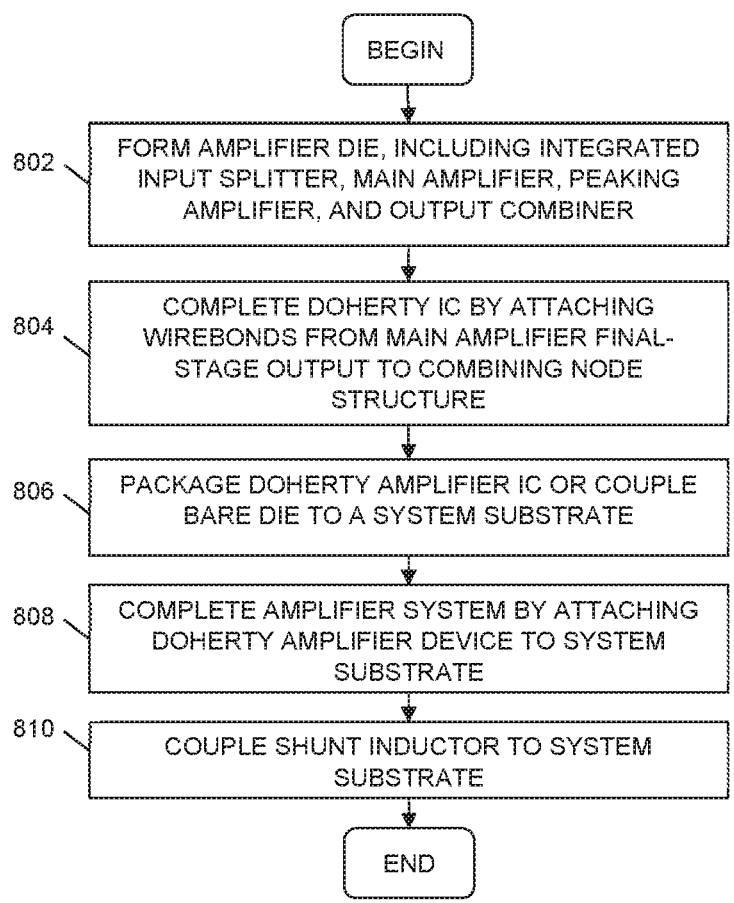
FIG. 8 is a flowchart of a method of making a Doherty power amplifier IC, and a packaged Doherty amplifier device, in accordance with an example embodiment.

FIG. 8 is a flowchart of a method of making a Doherty power amplifier IC (e.g., Doherty IC 200, FIG. 2), a packaged Doherty amplifier device (e.g., device 600, FIG. 6), and a Doherty amplifier system (e.g., system 700, FIG. 7), in accordance with an example embodiment. The method may begin, in block 802, by forming an amplifier die (e.g., die 201, FIG. 2), which includes integrally-formed main amplifier transistors (e.g., FETs 226, 230, FIG. 2), peaking amplifier transistors (e.g., FETs 246', 246", 250', 250", FIG. 2), and a combining node structure (e.g., combining node structure 290, FIG. 2). In addition, forming the amplifier die may include integrally-forming a power splitter (e.g., splitter 204, FIG. 2), matching networks (e.g., IMN 222, 242', 242", ISMN 228, 248', 248", FIG. 2), bias circuits (e.g., bias circuits 270, 270', 270", FIG. 2), VBW circuits (e.g., VBW circuits 280, 280', 280", FIG. 2), and/or other integrated components (e.g., capacitors 239, FIG. 2). In alternate embodiments, some of the circuits and components in the previous sentence may be implemented on substrates that are distinct from the amplifier die.

In block 804, the Doherty amplifier IC (e.g., Doherty amplifier IC 200, FIG. 2) is completed by connecting the output terminal (e.g., drain terminal 231, FIG. 2) of the main amplifier final-stage transistor (e.g., FET 230, FIG. 2) to the combining node structure (e.g., combining node structure 290, FIG. 2). For example, the connection may be made with wirebonds (e.g., wirebonds 238, FIG. 2) that have a predetermined length, height, and number to create a desired phase delay (e.g., 90 degrees) between the main and peaking amplifier outputs. In addition, additional wirebonds (e.g., wirebonds 294, FIG. 2) associated with an isolation structure (e.g., isolation structure 292, FIG. 2) also may be coupled to the die top surface between the wirebonds launching from the main amplifier final-stage transistor (e.g., wirebonds 238, FIG. 2) and the peaking amplifier final-stage transistors (e.g., FETs 250', 250", FIG. 2).

The Doherty amplifier IC (e.g., Doherty IC 200, FIG. 2) may then be packaged in block 806. As mentioned previously, the Doherty amplifier IC may be packaged in an overmolded or air-cavity power package. Alternatively, the Doherty amplifier IC may be attached as a bare die to a system substrate (e.g., a module or PCB substrate). When packaged in an overmolded package (e.g., package 604, FIG. 6), the Doherty amplifier IC may be connected to a conductive flange of a leadframe, wirebonds (e.g., wirebonds 650-656, 670, FIG. 6) may be coupled between input, output, and bias leads of the leadframe and appropriate bond pads of the Doherty amplifier IC, and the flange, leads, and Doherty amplifier IC may be encapsulated in molding compound. When packaged in an air-cavity package, an insulator frame may be attached to the top surface of a conductive flange, the Doherty amplifier IC may be connected to the top surface of the flange in the frame opening, input, output, and bias leads may be connected to the top surface of the insulator frame, wirebonds (e.g., wirebonds 650-656, 670, FIG. 6) may be coupled between the input, output, and bias leads and appropriate bond pads of the Doherty amplifier IC, and a cap may be applied over the flange, insulator frame, leads, wirebonds, and Doherty amplifier IC to encase the Doherty amplifier IC in an air cavity.

In block 808, the amplifier system (e.g., system 700, FIG. 7) may be completed by attaching the Doherty amplifier device (e.g., device 600, FIG. 6) (or in some embodiments the bare die) to a system substrate, such as a PCB (e.g., PCB 710, FIG. 7). More specifically, the bottom surface of the Doherty amplifier device may be connected to a conductive coin (e.g., coin 715, FIG. 7) to provide a ground reference and heat sink to the device, and the device's input, output, and bias leads may be connected to corresponding conductive paths (e.g., paths 730-734, FIG. 7) of the system substrate.

According to an embodiment, additional components may be coupled to the system substrate (e.g., PCB 710, FIG. 7), in block 810, to complete the amplifier system. For example, as described previously, a discrete inductor (e.g., inductor 750, FIG. 7) may be coupled between the Doherty amplifier device's output lead (e.g., output lead 728, FIG. 7) and a ground reference by coupling the inductor to conductive features (e.g., path 731 and feature 736, FIG. 7) of the system substrate. The method may then end.

An embodiment of a power amplifier includes a semiconductor die, an amplifier integrally formed with the semiconductor die, and a bias circuit integrally formed with the semiconductor die. The semiconductor die has opposed first and second sides, and a device bisection line extends between the opposed first and second sides. The amplifier has an input and an output. The bias circuit includes a multi-point input terminal with first and second terminals that are electrically connected through a conductive path that extends across the device bisection line, and one or more bias circuit components connected between the multi-point input terminal and the amplifier.

According to a further embodiment, the amplifier includes a field effect transistor (FET) with a gate terminal, and the one or more bias circuit components are electrically connected between the multi-point input terminal and the gate terminal. According to another further embodiment, the amplifier includes a pre-amplifier FET with a first gate terminal, and a final-stage amplifier FET with a second gate terminal, and the one or more bias circuit components include a resistor-divider circuit with at least one resistor electrically coupled between the multi-point input and the second gate terminal. According to yet another further embodiment, the amplifier includes a FET with a drain terminal, and the one or more bias circuit components are electrically connected between the multi-point input terminal and the drain terminal.

An embodiment of an amplifier device includes a device package and an integrated circuit. The device package includes a package substrate and a first lead at a first side of the device package. The integrated circuit is connected to the package substrate, and the integrated circuit includes a semiconductor die, an amplifier, and a bias circuit. The semiconductor die has opposed first and second sides, and the first side of the semiconductor die is proximate to and parallel with the first side of the device package. A device bisection line extends between the opposed first and second sides of the semiconductor die. The first amplifier is integrally formed with the semiconductor die and has an input and an output. The bias circuit is integrally formed with the semiconductor die, and the bias circuit includes a multi-point input terminal and one or more bias circuit components. The multi-point input terminal has a first terminal positioned on a first side of the device bisection line, and a second terminal positioned on a second side of the device bisection line, and the first and second terminals are electrically connected through a conductive path that extends across the device bisection line. The one or more bias circuit components are connected between the multi-point input terminal and the amplifier. The amplifier device further includes an electrically conductive connection coupled between the lead and one of the first and second terminals of the multi-point input terminal.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

As used herein, the words "exemplary" and "example" mean "serving as an example, instance, or illustration." Any implementation described herein as exemplary or an example is not necessarily to be construed as preferred or advantageous over other implementations. Furthermore, there is no intention to be bound by any expressed or implied theory presented in the preceding technical field, background, or detailed description.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A power amplifier comprising:
   a semiconductor die having opposed first and second sides, wherein a device bisection line extends between the opposed first and second sides;
   a first amplifier integrally formed with the semiconductor die; and
   a first bias circuit integrally formed with the semiconductor die, wherein the first bias circuit includes
   a first multi-point input terminal with first and second terminals that are electrically connected through a conductive path that extends across the device bisection line, and
   one or more first bias circuit components connected between the first multi-point input terminal and the first amplifier.

2. The power amplifier of claim 1, wherein each of the first and second terminals is a conductive bondpad that is exposed at a surface of the semiconductor die.

3. The power amplifier of claim 1, further comprising:
   an input terminal integrally formed with the semiconductor die and proximate to the first side of the semiconductor die, wherein an input of the first amplifier is electrically coupled to the input terminal; and
   an output terminal integrally formed with the semiconductor die and proximate to the second side of the semiconductor die, wherein an output of the first amplifier is electrically coupled to electrically coupled to the output terminal, and the device bisection line extends through the input terminal and the output terminal.

4. The power amplifier of claim 1, wherein the first amplifier includes a field effect transistor (FET) with a gate terminal, and wherein the one or more first bias circuit components are electrically connected between the first multi-point input terminal and the gate terminal.

5. The power amplifier of claim 1, wherein the first amplifier includes a field effect transistor (FET) with a drain terminal, and wherein the one or more first bias circuit components are electrically connected between the first multi-point input terminal and the drain terminal.

6. The power amplifier of claim 1, wherein the first amplifier includes a pre-amplifier field effect transistor (FET) with a first gate terminal, and a final-stage amplifier FET with a second gate terminal, and wherein the one or more first bias circuit components of the first bias circuit comprise:
a first resistor-divider circuit with at least one resistor electrically coupled between the first multi-point input and the second gate terminal.

7. The power amplifier of claim 6, wherein the first resistor-divider circuit comprises:
a first resistor with a first terminal electrically coupled to the first multi-point input terminal and to the first gate terminal; and
a second resistor electrically coupled between a ground reference and a node between the first and second resistors.

8. The power amplifier of claim 7, wherein the one or more first bias circuit components comprise:
a first radio frequency (RF) isolation circuit connected between the first multi-point input terminal and the first gate terminal; and
a second RF isolation circuit connected between the second resistor and the second gate terminal.

9. The power amplifier of claim 1, wherein the one or more first bias circuit components comprise a radio frequency (RF) isolation circuit connected between the first multi-point input terminal and the first amplifier.

10. The power amplifier of claim 1, further comprising:
a second amplifier integrally formed with the semiconductor die; and
a second bias circuit integrally formed with the semiconductor die, wherein the second bias circuit includes
a second multi-point input terminal with first and second terminals that are electrically connected through a second conductive path that extends across the device bisection line, and
one or more second bias circuit components connected between the second multi-point input terminal and the second amplifier.

11. An amplifier device comprising:
a device package that includes a package substrate and a first lead at a first side of the device package;
an integrated circuit connected to the package substrate, wherein the integrated circuit includes
a semiconductor die with opposed first and second sides, wherein the first side of the semiconductor die is proximate to and parallel with the first side of the device package, and wherein a device bisection line extends between the opposed first and second sides of the semiconductor die,
a first amplifier integrally formed with the semiconductor die and having an input and an output, and
a first bias circuit integrally formed with the semiconductor die, wherein the first bias circuit includes
a first multi-point input terminal with a first terminal positioned on a first side of the device bisection line, and a second terminal positioned on a second side of the device bisection line, wherein the first and second terminals are electrically connected through a conductive path that extends across the device bisection line, and
one or more first bias circuit components connected between the first multi-point input terminal and the first amplifier; and
a first electrically conductive connection coupled between the first lead and one of the first and second terminals of the first multi-point input terminal.

12. The amplifier device of claim 11, wherein:
each of the first and second terminals is a conductive bondpad that is exposed at a surface of the integrated circuit; and
the first electrically conductive connection comprises one or more wirebonds.

13. The amplifier device of claim 11, wherein:
the device package further includes a second lead at the first side of the device package, wherein the first lead is positioned on the first side of the device bisection line, and the second lead is positioned on the second side of the device bisection line.

14. The amplifier device of claim 11, wherein:
the device package further includes a second lead at the first side of the device package;
the integrated circuit further includes an input terminal integrally formed with the semiconductor die and proximate to the first side of the semiconductor die, wherein the input of the first amplifier is electrically coupled to the input terminal, wherein the device bisection line extends through the input terminal, and wherein the input terminal includes a conductive bondpad that is exposed at a surface of the semiconductor die; and
the amplifier device further includes a second electrically conductive connection coupled between the second lead and the input terminal.

15. The amplifier device of claim 14, wherein:
the device package further includes a third lead at a second side of the device package;
the integrated circuit further includes an output terminal integrally formed with the semiconductor die and proximate to the second side of the semiconductor die, wherein the output of the first amplifier is electrically coupled to the output terminal; and
the amplifier device further includes a third electrically conductive connection coupled between the output terminal and the third lead.

* * * * *